US008358446B2

(12) United States Patent
Tanaka et al.

(10) Patent No.: US 8,358,446 B2

(45) Date of Patent: Jan. 22, 2013

(54) READING APPARATUS, IMAGE FORMING APPARATUS AND IMAGE FORMING METHOD

(75) Inventors: Yasuyuki Tanaka, Kanagawa (JP); Akira Ishii, Kanagawa (JP); Masao Ito, Kanagawa (JP); Yoshiya Imoto, Kanagawa (JP); Kenji Hyoki, Kanagawa (JP); Yoshifumi Takebe, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 637 days.

(21) Appl. No.: 12/171,507

(22) Filed: Jul. 11, 2008

(65) Prior Publication Data

US 2009/0122360 A1 May 14, 2009

(30) Foreign Application Priority Data

Nov. 14, 2007 (JP) ................................ 2007-295201

(51) Int. Cl.

| | |
|---|---|
| ***H04N 1/60*** | (2006.01) |
| ***H04N 1/04*** | (2006.01) |
| ***H04N 1/38*** | (2006.01) |
| ***H04N 1/393*** | (2006.01) |
| ***H04N 1/46*** | (2006.01) |
| ***H04N 5/228*** | (2006.01) |
| ***G05B 19/18*** | (2006.01) |
| ***G06K 9/40*** | (2006.01) |
| ***G01C 3/08*** | (2006.01) |
| ***G03G 15/01*** | (2006.01) |
| ***G03B 27/04*** | (2006.01) |
| ***H01L 27/00*** | (2006.01) |
| ***B41J 2/01*** | (2006.01) |
| ***B41J 3/407*** | (2006.01) |
| ***B41J 15/14*** | (2006.01) |

(52) U.S. Cl. ......... 358/474; 358/1.9; 358/463; 358/451; 358/509; 358/498; 700/56; 382/275; 356/4.03; 362/281; 101/211; 399/301; 355/82; 250/208.1; 347/243; 347/102; 347/106; 347/244; 348/222.1

(58) Field of Classification Search ................. 358/474, 358/451; 700/56; 101/211; 356/4.03; 382/275; 347/244; 399/301

See application file for complete search history.

(56) References Cited

U.S. PATENT DOCUMENTS 4,578,331 A * 3/1986 Ikeda et al. .................. 430/42.1
5,737,216 A * 4/1998 Hokari ............................ 700/56

(Continued)

FOREIGN PATENT DOCUMENTS

JP 06-079864 3/1994

(Continued)

*Primary Examiner* — Charlotte M Baker
*Assistant Examiner* — Rury Grisham
(74) *Attorney, Agent, or Firm* — Morgan, Lewis & Bockius LLP

(57) ABSTRACT

The reading apparatus is provided with: an optical image forming unit that forms an optical image on a recording medium by irradiating, with light, the recording medium on which an image is formed and which is transported in a slow scan direction; a reading unit that reads a position in a fast scan direction of the image formed on the recording medium transported in the slow scan direction and a position in a fast scan direction of the optical image, by using a minification optical system; and a registration correction unit that corrects a registration error in the fast scan direction of the image read by the reading unit, by using the position in the fast scan direction of the optical image read by the reading unit.

9 Claims, 18 Drawing Sheets

U.S. PATENT DOCUMENTS

| | | | | |
|---|---|---|---|---|
| 6,129,015 | A * | 10/2000 | Dewey | 101/211 |
| 6,246,857 | B1 * | 6/2001 | Tanaka | 399/301 |
| 6,632,004 | B2 * | 10/2003 | Sugawara et al. | 362/281 |
| 6,697,147 | B2 * | 2/2004 | Ko et al. | 356/4.03 |
| 7,098,938 | B2 * | 8/2006 | Yoshida | 347/244 |
| 7,391,928 | B2 * | 6/2008 | Takayama et al. | 382/275 |
| 7,798,634 | B2 * | 9/2010 | Miyahara et al. | 347/106 |
| 2004/0022561 | A1 * | 2/2004 | Tanaka et al. | 399/301 |
| 2005/0275909 | A1 * | 12/2005 | Takayama et al. | 358/509 |
| 2008/0123157 | A1 * | 5/2008 | Kinoshita | 358/451 |
| 2009/0122360 | A1 * | 5/2009 | Tanaka et al. | 358/474 |

FOREIGN PATENT DOCUMENTS

| | | |
|---|---|---|
| JP | 09-275472 | 10/1997 |
| JP | 2002-337327 | 11/2002 |
| JP | 2003-255475 | 9/2003 |
| JP | 2004-037440 | 2/2004 |

* cited by examiner

READING APPARATUS, IMAGE FORMING APPARATUS AND IMAGE FORMING METHOD

CROSS REFERENCE TO RELATED APPLICATIONS

This application is based on and claims priority under 35 USC §119 from Japanese Patent Application No. 2007-295201 filed Nov. 14, 2007.

BACKGROUND

1. Technical Field

The present invention relates to a reading apparatus that reads an image formed on a recording medium, an image forming apparatus that forms an image on a recording medium, and an image forming method.

2. Related Art

In an image forming apparatus such as a printer and the like, there exists a unit performing displacement control (print registration control) for suppressing the displacement of an image by measuring in advance a displacement amount of an image formed on a recording medium such as paper and the like. For example, conventionally, a test image which is called as a registration mark is formed and outputted on a recording medium by an image forming apparatus, the outputted paper is placed on a platen glass of an image reading apparatus for reading, and then the actual forming position of the registration mark relative to the paper is recognized from the reading results, thereby adjusting a parameter used for the displacement control of the recording medium in the image forming apparatus.

SUMMARY

According to an aspect of the invention, there is provided a reading apparatus including: an optical image forming unit that forms an optical image on a recording medium by irradiating, with light, the recording medium on which an image is formed and which is transported in a slow scan direction; a reading unit that reads a position in a fast scan direction of the image formed on the recording medium transported in the slow scan direction and a position in a fast scan direction of the optical image, by using a minification optical system; and a registration correction unit that corrects a registration error in the fast scan direction of the image read by the reading unit, by using the position in the fast scan direction of the optical image read by the reading unit.

BRIEF DESCRIPTION OF THE DRAWINGS

Exemplary embodiment(s) of the present invention will be described in detail based on the following figures, wherein.

DETAILED DESCRIPTION

Hereinafter, a description will be given for exemplary embodiments of the present invention in detail, with reference to the attached drawings.

In this application, registration of images to be formed (printed) on a recording medium (e.g., a paper sheet) in a printing process is referred to as "print registration", and registration of optically read test images for preparing the print registration is simply referred to as "registration."

<First Exemplary Embodiment>

Figure 1:
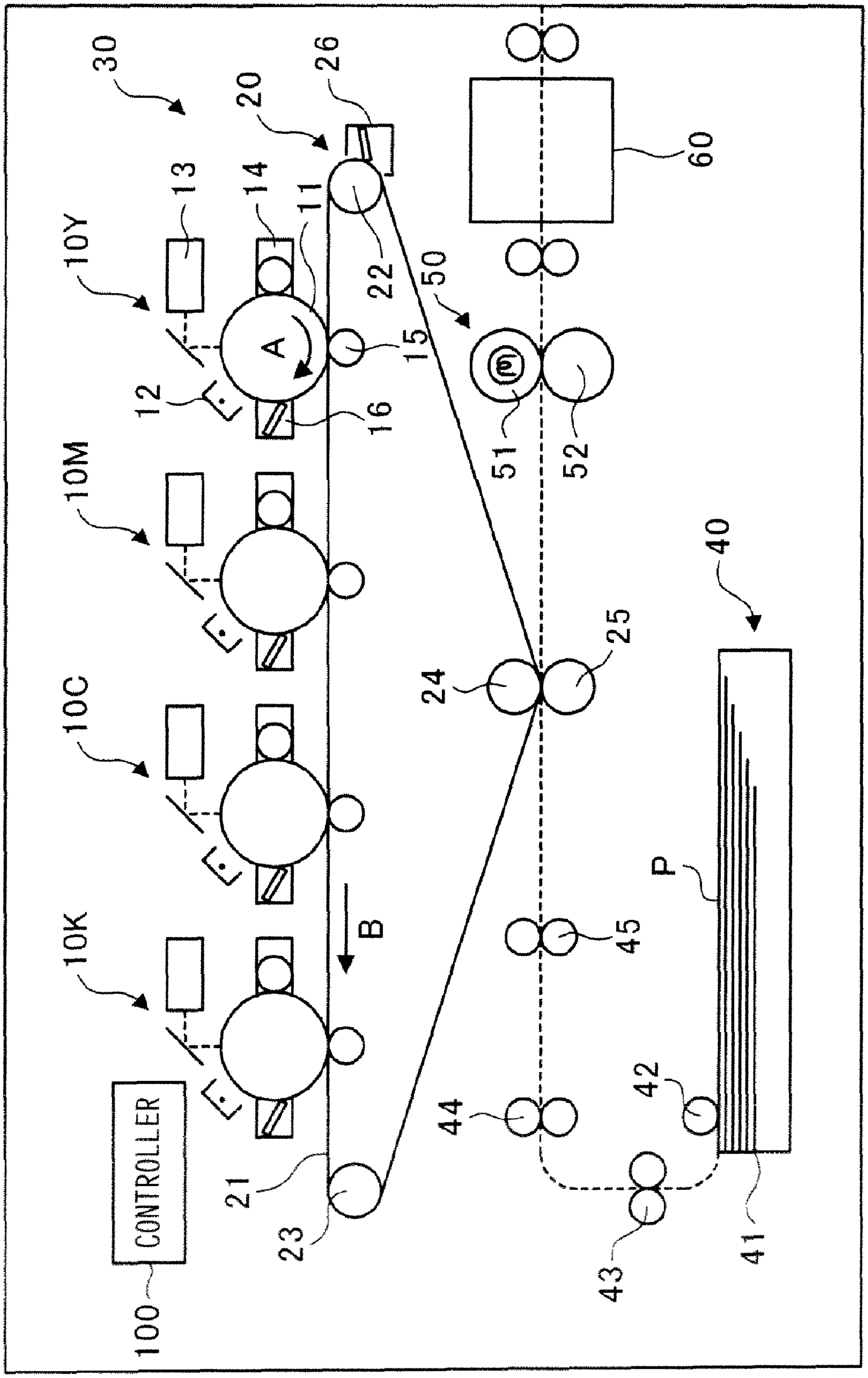
FIG. 1 is a view showing a configuration of an image forming apparatus to which the first exemplary embodiment is applied.

FIG. 1 is a view showing a configuration of an image forming apparatus to which the first exemplary embodiment is applied. The image forming apparatus is provided with plural image forming parts 10, a transfer part 20, a paper-sheet supplying part 40, a fixing part 50, and an image capturing part 60. It should be noted that, in the following description, the plural image forming parts 10 and the transfer part 20 that function as an image forming unit are collectively called as an image forming unit 30. The image forming apparatus is further provided with a controller 100 that controls operation of the image forming unit 30, the paper-sheet supplying part 40, the fixing part 50 and the image capturing part 60.

The plural image forming parts 10 includes a yellow image forming part 10Y that forms a yellow image, a magenta image forming part 10M that forms a magenta image, a cyan image forming part 10C that forms a cyan image, and a black image forming part 10K that forms a black image. The yellow image forming part 10Y, the magenta image forming part 10M, the cyan image forming part 10C, and the black image forming part 10K respectively form toner images of the corresponding color components, that is to say, images, with an electrophotographic method.

Each of the image forming parts 10Y, 10M, 10C and 10K has a similar configuration except a color of used toner. Thus, a description will be given for the yellow image forming part 10Y as an example. The yellow image forming part 10Y is provided with a photoconductor drum 11, a charging device 12, an exposure device 13, a development device 14, a primary transfer roll 15 and a photoconductor cleaner 16. Among them, the photoconductor drum 11 is provided with a photoconductor layer (not shown in the figure) on the outer circumferential surface, and rotates in an arrow A direction in the figure. The charging device 12 charges the photoconductor layer on the photoconductor drum 11 at a predetermined voltage. The exposure device 13 exposes the charged photoconductor layer of the photoconductor drum 11 and forms an electrostatic latent image. The development device 14 contains corresponding color component toner (e.g. yellow toner is contained in the yellow image forming part 10Y), and develops the electrostatic latent image formed on the photoconductor drum 11 with the toner. The primary transfer roll 15 primarily transfers the toner image formed on the photoconductor drum 11 onto an intermediate transfer belt 21 which will be described later. The photoconductor cleaner 16 removes remaining toner and the like on the photoconductor drum 11 after the primary transfer.

The transfer part 20 is provided with the intermediate transfer belt 21, a driving roll 22, a hanging roll 23, a back-up roll 24, a secondary transfer roll 25, and an intermediate transfer cleaner 26.

The intermediate transfer belt 21 is hanged between the driving roll 22, the hanging roll 23 and the back-up roll 24, and rotates in an arrow B direction. Among them, the driving roll 22 transmits driving force to the intermediate transfer belt 21. The hanging roll 23 rotates in accordance with the rotation of the intermediate transfer belt 21. Further, the back-up roll 24 rotates in accordance with the rotation of the intermediate transfer belt 21. The secondary transfer roll 25 is arranged so as to be opposed to the back-up roll 24 through the intermediate transfer belt 21. The back-up roll 24 and the secondary transfer roll 25 function as a secondary transfer unit that secondarily transfers the toner images that have been primarily transferred onto the intermediate transfer belt 21, onto a paper sheet P that will be described later. The intermediate transfer cleaner 26 removes remaining toner and the like on the intermediate transfer belt 21 after the secondary transfer.

The paper-sheet supplying part 40 functioning as a transporting unit is provided with a paper-sheet storage portion 41, a pick-up roll 42, separation rolls 43, pre-registration rolls 44 and registration rolls 45. The paper-sheet storage portion 41 is in the shape of a rectangular solid having an opening at the top thereof, and stores paper sheets P as a recording medium. The pick-up roll 42 is disposed above the paper-sheet storage portion 41, and takes out the uppermost paper sheet P from the bundle of the paper sheet P stored in the paper-sheet storage portion 41. The separation rolls 43 separate the paper sheets P taken out by the pick-up roll 42 one by one and transport the paper sheet P. The pre-registration rolls 44 further transport the paper sheet P transported via the separation rolls 43 toward the downstream side, while providing loop formation of the paper sheet P by working with the registration rolls 45. The registration rolls 45 stop once so that the transportation of the paper sheet P is temporally stopped, and resume the rotation at a right timing so that the paper sheet P is supplied to the secondary transfer unit.

The fixing part 50 is provided on the downstream side of the secondary transfer unit in the transporting direction of the paper sheet P. The fixing part 50 is provided with a heat roll 51 that has a heater inside thereof, and a pressure roll 52 that is in contact with the heat roll 51, and fixes the toner images that have been transferred onto the paper sheet P, with heat and pressure.

The image capturing part 60 functioning as a reading apparatus is provided on the downstream side of the fixing part 50 in the transporting direction of the paper sheet P. The image capturing part 60 has a function in which one face of the paper sheet P discharged from the fixing part 50 is captured. More specifically, the one face on which the toner image is formed is captured. A detailed description will be given for the image capturing part 60 later.

Next, a description will be given for an image forming process of the image forming apparatus. When a digital image signal is transmitted from a scanner or a computer apparatus (which are not illustrated in the figure), the controller 100 drives the respective image forming parts 10 (more specifically, 10Y, 10M, 10C and 10K) in response to the digital image signals of the respective colors. Then, in each of the image forming parts 10, an electrostatic latent image in accordance with the digital image signal is written on the photoconductor drum 11 that has been uniformly charged by the charging device 12, by the exposure device 13. The electrostatic latent image formed on the photoconductor drum 11 is then developed by the development device 14 so as to form each color toner image.

Thereafter, the toner images formed on the respective photoconductor drums 11 are sequentially transferred from the respective photoconductor drums 11 to the surface of the intermediate transfer belt 21 by the primary transfer rolls 15 at the primary transfer positions on which the respective photoconductor drums 11 are in contact with the intermediate transfer belt 21. On the other hand, toner remaining on the photoconductor drum 11 after the transfer is cleaned by the photoconductor cleaner 16.

As described above, the toner images that have been primarily transferred onto the intermediate transfer belt 21 are superimposed on the intermediate transfer belt 21, and transported to the secondary transfer position in accordance with the rotation of the intermediate transfer belt 21. On the other hand, the paper-sheet supplying part 40 supplies a paper sheet P to the secondary transfer position at a predetermined timing, and the paper sheet P is sandwiched between the intermediate transfer belt 21 and the secondary transfer roll 25.

Then, at the secondary transfer position, by an action of a transfer electric field formed between the secondary transfer roll 25 and the back-up roll 24, the toner images held on the intermediate transfer belt 21 are secondarily transferred onto the paper sheet P. The paper sheet P onto which the toner images have been transferred is transported to the fixing part 50, and the toner images on the paper sheet P are fixed with heat and pressure in the fixing part 50. After that, the paper sheet P on which the toner images have been fixed is discharged to an exit tray (not shown in the figure) provided outside the apparatus. On the other hand, toner remaining on the intermediate transfer belt 21 after the transfer is cleaned by the intermediate transfer cleaner 26.

Figure 2:
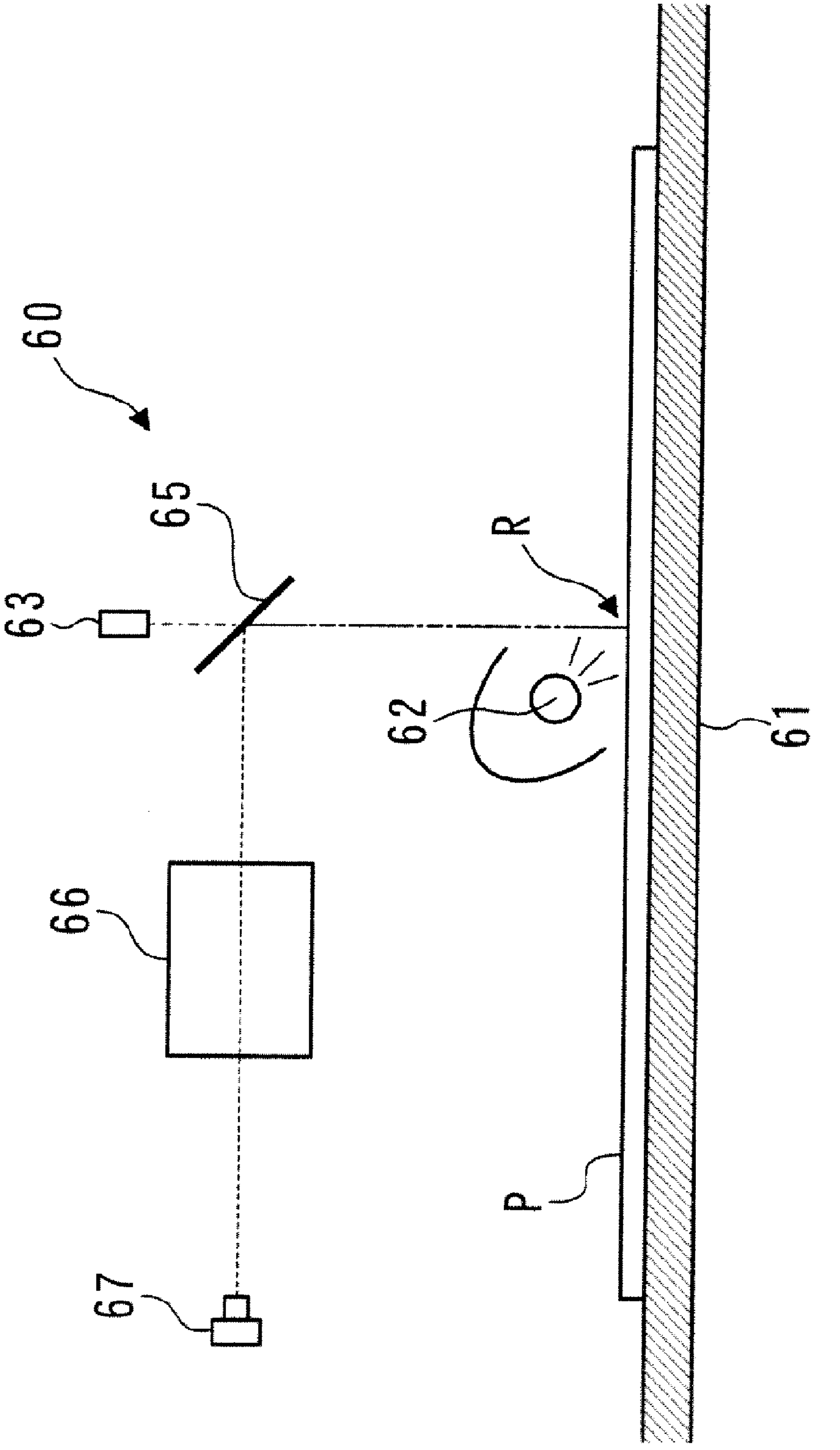
FIG. 2 is a view for explaining a configuration of the image capturing part seen from the front side of the paper in FIG. 1.

FIG. 2 is a view for explaining a configuration of the above-described image capturing part 60 seen from the front side of the paper in FIG. 1. In FIG. 2, a paper sheet P is transported from the left side to the right side by a transporting roll and the like, which are not shown in FIG. 2.

Figure 3:
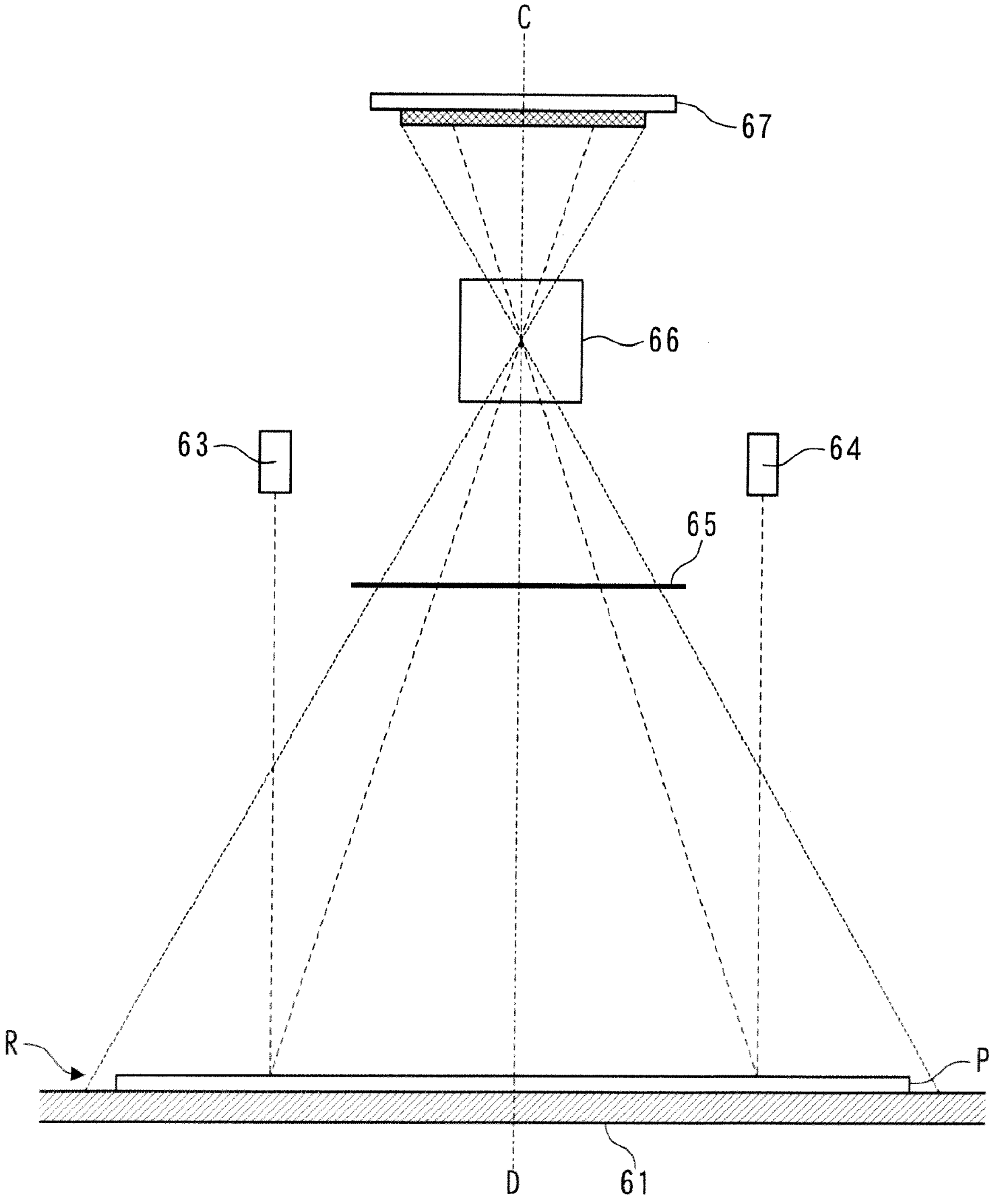
FIG. 3 is a view showing an image capturing light path of the image capturing part seen from the fast scan direction on a plane surface.

FIG. 3 is a view showing an image capturing light path of the image capturing part 60 seen from the fast scan direction on a plane surface. In FIG. 3, a paper sheet P is transported from the front side to the back side. It should be noted that a light source for image capture 62 described later is not shown in FIG. 3.

The image capturing part 60 is provided with a plate guiding member 61 that guides the transported paper sheet P, the light source for image capture 62 which irradiates the transported paper sheet P with light for image capture from the upper side of the transported paper sheet P, a first spot light source 63 and a second spot light source 64 which individually irradiate the transported paper sheet P with a spot light from the upper side of the paper sheet P, a mirror 65 which further reflects perpendicularly the reflected light which has been reflected in the vertical direction of the paper sheet P at the reading position R, a lens 66 which optically minificates an incident optical image from the mirror 65, and a CCD (charged coupled device) image sensor 67 which receives outgoing light from the lens 66 and performs photo-electric conversion. That is, in this example, the image capturing part 60 forms an optical image on the CCD image sensor 67 by using a so-called minification optical system.

Here, the light source for image capture 62 functioning as a first irradiating unit is configured by a white fluorescent lamp or the like which irradiates a whole area in the fast scan direction of the paper sheet P with light for image capture. On the other hand, the first spot light source 63 and the second spot light source 64, which function as a second irradiating unit or an optical image forming unit, include a laser light source such as a semiconductor laser and the like which emits, for example, red light. These first spot light source 63 and second spot light source 64 are individually arranged so as to be line symmetry relative to a light axis center C in the fast scan direction of the CCD image sensor 67. Specifically, the first spot light source 63 and the second spot light source 64 are attached so that they are arranged at a predetermined interval in the fast scan direction perpendicular to the paper-sheet transporting direction and arranged to be aligned with each other in the slow scan direction which is the paper-sheet transporting direction, and thus each of them emits a spot light perpendicularly with respect to the guiding member 61. In the first exemplary embodiment, since such a configuration is employed, as a reflected light, the light for image capture which is emitted from the light source for image capture 62 and reflected by the paper sheet P, and a first spot light and a second spot light which are respectively emitted from the first spot light source 63 and the second spot light source 64 and reflected by the paper sheet P fall on the CCD image sensor 67. It should be noted that, in the image forming apparatus, regardless of the size of the paper sheet P, there is employed a central registration system in which a paper sheet P is transported by setting a fast scan direction center D of the paper sheet P as a standard position. For this reason, the paper sheet P is transported so that the fast scan direction center D thereof nearly corresponds to the light axis center C of the CCD image sensor 67.

Here, in the first exemplary embodiment, when the paper sheet P is placed on the guiding member 61, a light path length from an image forming face of the paper sheet P to a focus of the lens 66 through the mirror 65 is set to 400 mm. Further, a light path length from a focus of the lens 66 to an image forming face of the CCD image sensor 67 is set to 82.8 mm. By so doing, a reading magnification in the image capturing part 60 is approximately 0.207. Furthermore, a reading width in the fast scan direction is set to 338 mm. Therefore, a distance from the light axis center C to an end portion of the reading width is 169 mm.

Figure 4:
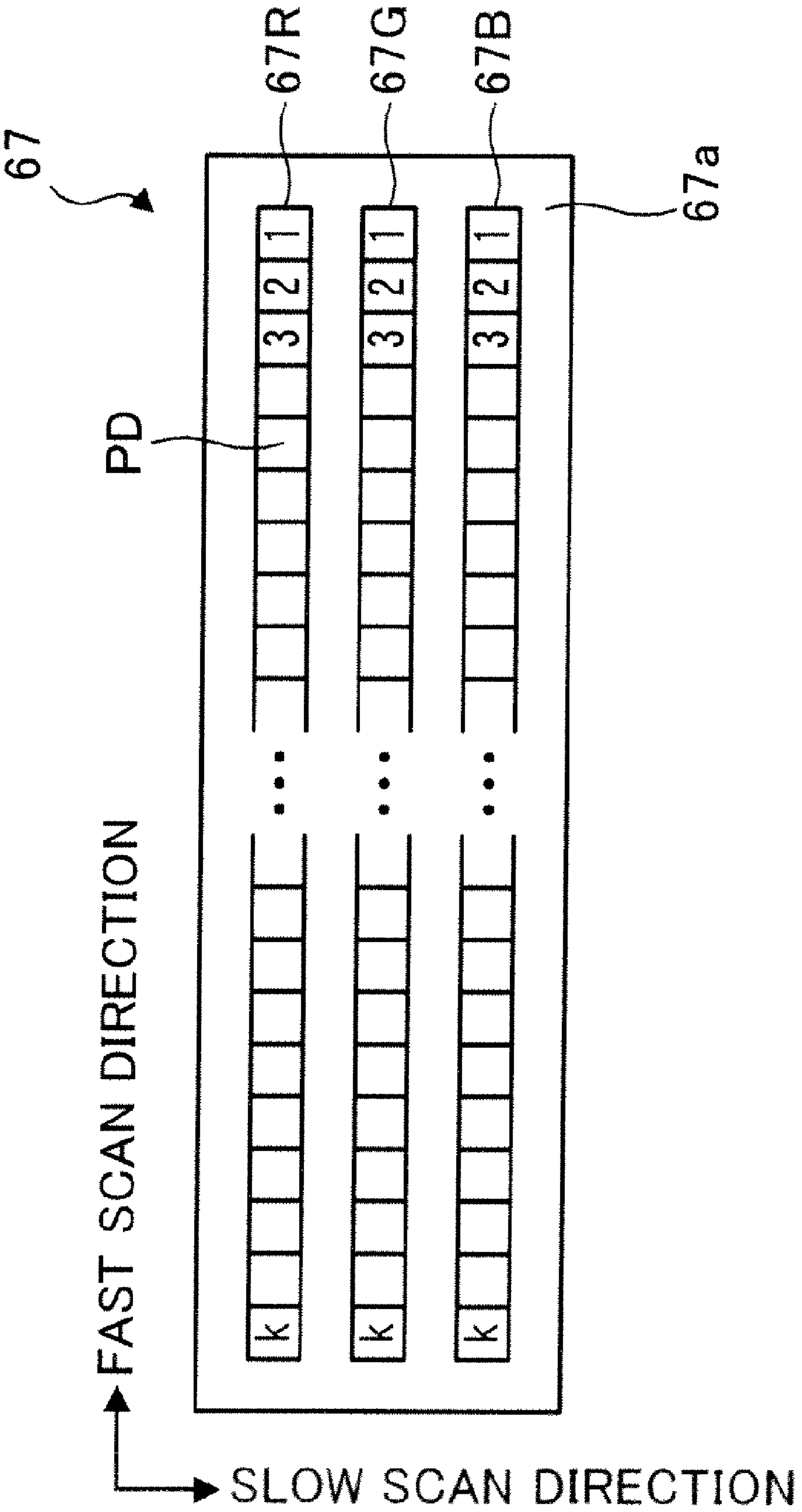
FIG. 4 is a view showing a rough configuration of the CCD image sensor functioning as a reading unit or a light receiving unit.

FIG. 4 is a view showing a rough configuration of the CCD image sensor 67 functioning as a reading unit or a light receiving unit.

The CCD image sensor 67 has a rectangular sensor substrate 67*a* and three pixel columns 67R, 67G and 67B which are attached in parallel on the sensor substrate 67*a*. In the following explanation, these three pixel columns 67R, 67G and 67B are referred to as a red pixel column 67R, a green pixel column 67G, and a blue pixel column 67B, respectively. The red pixel column 67R, the green pixel column 67G, and the blue pixel column 67B are individually arranged along the fast scan direction. In addition, the red pixel column 67R, the green pixel column 67G, and the blue pixel column 67B are arranged to be aligned in the slow scan direction. These red pixel column 67R, green pixel column 67G, and blue pixel column 67B each include k pieces (k=8000 in the first exemplary embodiment) of photodiodes PD which are linearly arranged. Further, in the red pixel column 67R, the green pixel column 67G and the blue pixel column 67B, an interval between the adjacent pixels is set to, for example, 8.77 μm. Color filters for transmitting different wavelength components are equipped in the red pixel column 67R, the green pixel column 67G, and the blue pixel column 67B, respectively. In addition, the length in the fast scan direction of the red pixel column 67R, green pixel column 67G, and blue pixel column 67B is 70 mm. Therefore, the length from the light axis center C to an end portion of each pixel column is 35 mm.

By the above configuration, in the image capturing part 60, reading resolution in the fast scan direction is set to 600 spi (spot per inch).

In the image forming apparatus, the image forming unit 30 forms a test image relative to a paper sheet P, the image capturing part 60 directly reads the test image on the paper sheet P, and a print registration adjustment operation for the paper sheet P is performed based on the reading results. Thus, a forming position of an image relative to the paper sheet P is adjusted.

However, in the image forming apparatus, since the image capturing part 60 reads the test image formed on the transported paper sheet P, if the paper sheet P floats from the guiding member 61 and a skew of the paper sheet P occurs at the reading position of the image capturing part 60, an error due to the floating or skew is tolerated in the reading results by the CCD image sensor 67. Thus, an adequate adjustment may not be performed.

Consequently, in the first exemplary embodiment, the forming position of the test image relative to the paper sheet P is accurately obtained by performing correction of the floating or skew of the paper sheet P on the reading results of the test image, that is, a captured image (image capturing data) captured by the CCD image sensor 67. In particular, in the first exemplary embodiment, the floating of the paper sheet P at the reading position is recognized by using the results obtained by reading the first spot light and the second spot light from the above described first spot light source 63 and the second spot light source 64 for irradiating the paper sheet P, that is, an optical image, with the CCD image sensor 67. Hereinafter, this will be explained in detail.

Figure 5:
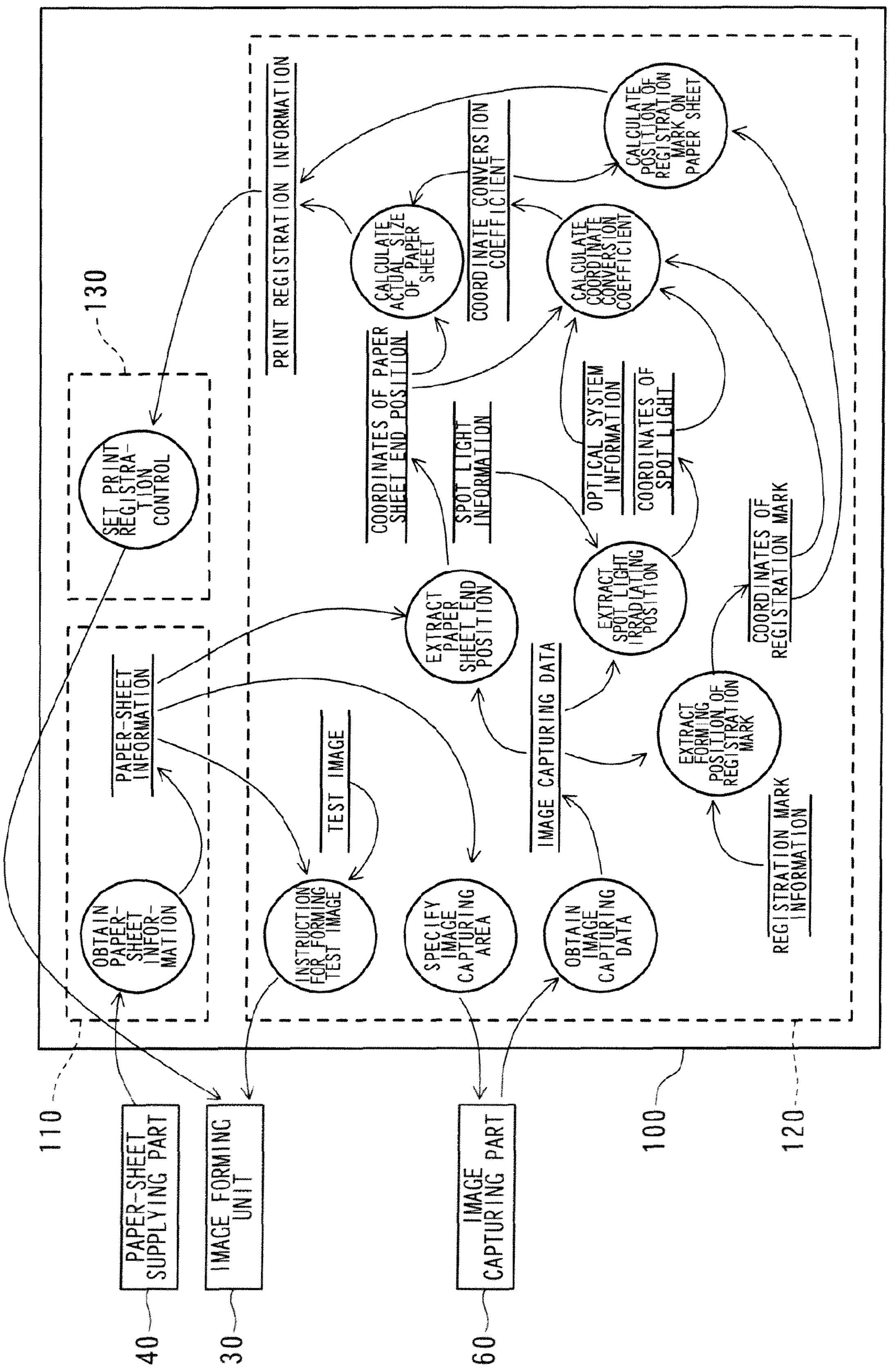
FIG. 5 is a diagram showing the functional blocks of the controller and a data flow in the controller.

FIG. 5 is a diagram showing the functional blocks of the controller 100 and a data flow in the controller 100. It should be noted that, the functions relating to the print registration adjustment operation are extracted from various kinds of functions of the controller 100 and shown in FIG. 5.

The controller 100 is provided with a paper-sheet information management portion 110, a print registration information generation portion 120, and a print registration setting portion 130.

Among them, the paper-sheet information management portion 110 manages paper-sheet information on the paper sheet P stored in the paper-sheet supplying part 40. The print registration information generation portion 120 functioning as a registration correction unit or a magnification correction unit, allows the image forming unit 30 to form a test image on the paper sheet P, and generates print registration information on transportation and supply of the paper sheet P from image capturing data obtained by reading a test image formed on the paper sheet P by the image forming unit 30, in the image capturing part 60. Further, the print registration setting portion 130 functioning as a setting unit, performs the setting of print registration control in the image forming unit 30, based on the print registration information generated by the print registration information generation portion 120.

The controller 100 is provided with a central processing unit (CPU), a read only memory (ROM), a random access memory (RAM) and the like, which are not shown in the figure. The CPU reads a program stored in the ROM, and executes the read program while transmitting and receiving data to and from the RAM as necessary. In the ROM and the RAM, various kinds of data used in processings are stored, as necessary.

Figure 6:
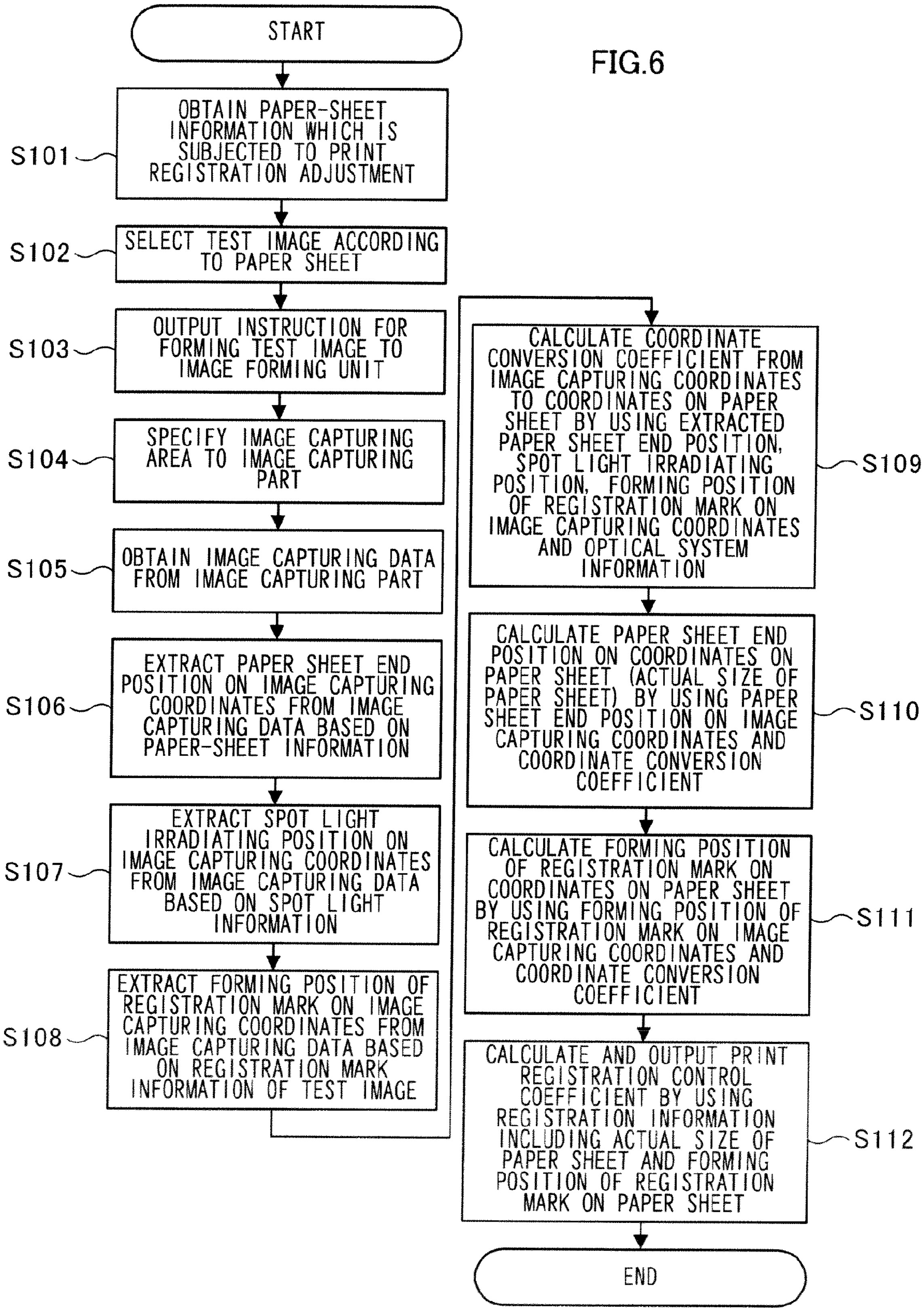
FIG. 6 is a flowchart for explaining a processing flow in the print registration adjustment operation according to the first exemplary embodiment.

A processing flow in the print registration adjustment operation is described with reference to FIG. 5 and a flowchart shown in FIG. 6. FIG. 6 is a flowchart for explaining a processing flow in the print registration adjustment operation according to the first exemplary embodiment. This processing is started by receiving an execution instruction of print registration adjustment from a user interface or the like which are not shown in the figure.

In the controller 100 receiving the execution instruction of print registration adjustment, first, the paper-sheet information management portion 110 obtains paper-sheet information of a paper sheet P which is subjected to the print registration adjustment (step 101). Here, the paper-sheet information is related to a size or a direction of the paper sheet P stored in the paper-sheet storage portion 41 of the a paper-sheet supplying part 40, and the paper-sheet information management portion 110 has access to the paper-sheet storage portion 41 to obtain the paper-sheet information of the stored paper sheet P, and holds it in an internal memory.

Next, the print registration information generation portion 120 refers to the paper-sheet information held in the paper-sheet information management portion 110, selects a test image according to the paper sheet P (step 102), and outputs an instruction for forming the test image to the image forming unit 30 (step 103). Here, the test image includes a registration mark described later, and plural kinds of test images are prepared in advance according to a size and a direction of a paper sheet P, and stored in a memory. Subsequently, the print registration information generation portion 120 specifies an image capturing area according to the paper-sheet information to the image capturing part 60 (step 104).

Thereafter, in the above image forming process, a test image is formed by the image forming unit 30 and the test image is transferred and fixed on the paper sheet P supplied from the paper-sheet supplying part 40. While the paper sheet P and the test image formed on the paper sheet P are transported, they are captured by the image capturing part 60. At this time, in the image capturing part 60, while the light source for image capture 62 irradiates, with the light for image capture, the test image forming face of the paper sheet P passing through the reading position R, the first spot light source 63 irradiates the test image forming face with a first spot light and the second spot light source 64 irradiates the test image forming face with a second spot light. Then, the CCD image sensor 67 receives reflected light from the paper sheet P at the reading position R through the mirror 65 and the lens 66. Accordingly, image capturing data for one line in the fast scan direction of the paper sheet P is obtained, and this process is sequentially performed over the whole area in the slow scan direction of the transported paper sheet P to obtain image capturing data for one paper sheet P. It should be noted that, the image capturing data also include image capturing data of an outside of end portions of the paper sheet P. This is to securely obtain the data of the whole area of the paper sheet P and to utilize the end positions of the paper sheet P for skew correction described later.

Subsequently, the print registration information generation portion 120 obtains the image capturing data for one paper sheet P from the image capturing part 60 (step 105). It should be noted that, the obtained image capturing data are stored in the memory.

Next, the print registration information generation portion 120 extracts a paper sheet end position on image capturing coordinates from the image capturing data, based on the paper-sheet information read out from the paper-sheet information management portion 110 (step 106). Then, the resulting data of the paper sheet end position is stored in the memory. The image capturing coordinates will be described later in detail. Subsequently, the print registration information generation portion 120 extracts a spot light irradiating position on the image capturing coordinates from the image capturing data, based on spot light information stored in the inside (step 107). Here, the spot light information includes the irradiating positions of the first spot light source 63 and the second spot light source 64, a color (wavelength) and irradiation intensity of the spot light and the like, which are stored in the memory in advance. Further, the print registration information generation portion 120 extracts a forming position of a registration mark on the image capturing coordinates from the image capturing data, based on the registration mark information of the test image (step 108). Here, the registration mark information includes the number, a position, a color, a shape and the like of the registration mark contained in the test image determined according to the size and the direction of the paper sheet P, which are stored in the memory in advance.

Then, the print registration information generation portion 120 calculates a coordinate conversion coefficient from the image capturing coordinates to the coordinates on the paper sheet by using the paper sheet end position extracted in the above step 106, the spot light irradiating position extracted in step 107, the forming position of the registration mark extracted in step 108 and optical system information (step 109). Here, the optical system information includes various kinds of information on the optical system of the image capturing part 60, such as, a distance from CCD image sensor 67 to the lens 66, a distance from the lens 66 to the paper-sheet transportation path, further specifications of the CCD image sensor 67 and the like, which are stored in the memory in advance. The coordinates on the paper sheet and the coordinate conversion coefficient will be explained later in detail.

Next, the print registration information generation portion 120 calculates the paper sheet end position on the coordinates on the paper sheet, that is, an actual size of the paper sheet P, by using the paper sheet end position on the image capturing coordinates extracted in the above step 106 and the coordinate conversion coefficient calculated in the above step 109 (step 110). The resulting data of the actual size of the paper sheet P are stored in the memory. Subsequently, the print registration information generation portion 120 calculates the forming position of the registration mark on the coordinates on the paper sheet, that is, on the paper sheet P, by using information on the forming position of the registration mark on the image capturing coordinates extracted in the above step 108 and the coordinate conversion coefficient calculated in the above step 109 (step 111). The resulting data of the forming position of the registration mark on the paper sheet P are stored in the memory. It should be noted that both information on the actual size of the paper sheet P calculated in the above step 110 and information on the forming position of the registration mark on the paper sheet P calculated in the above step 111 become the above-described print registration information.

The print registration setting portion 130 recognizes the actual forming position of the registration mark relative to the paper sheet P with reference to the print registration information prepared by the print registration information generation portion 120, and, in order to correct the difference with the target forming position of the registration mark, the print registration setting portion 130 calculates timing of supplying the paper sheet P at the paper-sheet supplying part 40, a contact condition between the intermediate transfer belt 21 and the secondary transfer roll 25 at the secondary transfer unit of the image forming unit 30, and further a print registration control coefficient relating to a transportation speed of the paper sheet P and the like, and outputs them to the imaging forming unit 30 and the paper-sheet supplying part 40 (step 112). Thereafter, the image forming unit 30 resets parameters of each configuration according to the inputted print registration control coefficient and prepares for the subsequent image forming operation under the condition where the print registration adjustment is performed.

Next, a description will be given for the coordinate conversion coefficient calculated in the above step 109.

First, a description will be given for a relationship between the floating of the paper sheet P at the reading position R and the captured image (image capturing data) obtained by the CCD image sensor 67 with reference to FIG. 7.

Firstly, for the captured image obtained by capturing the paper sheet P with the CCD image sensor 67, a coordinate system O-xy is given as the image capturing coordinates in which the length of the paper sheet P in the fast scan direction and the slow scan direction is equal to the actual size when there is no floating of the paper sheet P and the original point is set to the left upper end of the image capturing position (refer to FIG. 9A described later).

Figure 7:
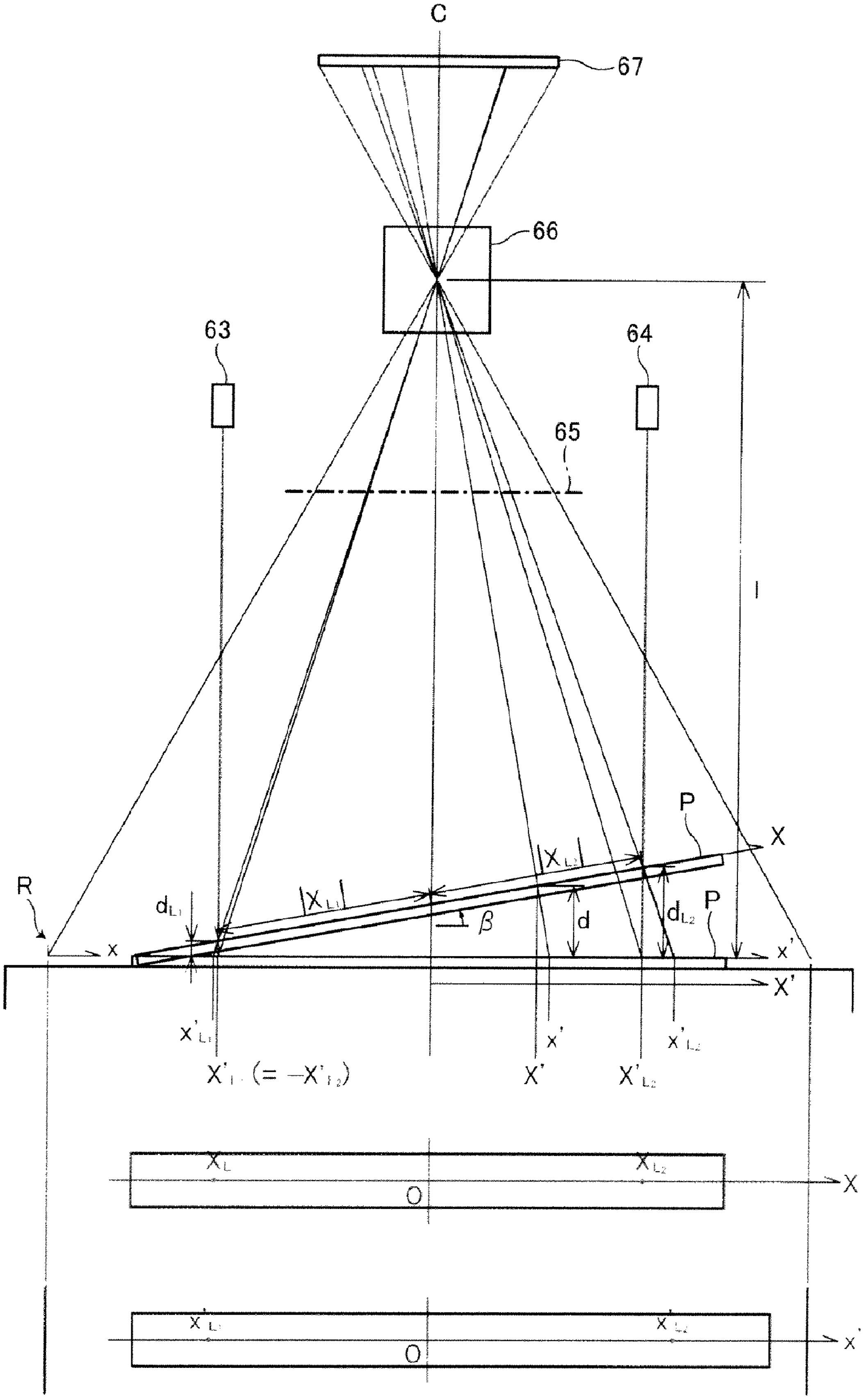
FIG. 7 is a view for explaining the relationship between the floating of the paper sheet at the reading position of the CCD image sensor and the captured image (image capturing data) obtained by the CCD image sensor.

It should be noted that, in this description, as shown in FIG. 7, it is assumed that, in a cross section parallel to the fast scan direction, the paper sheet P maintains a nearly linear shape.

If a coordinate system O-x' in which the original point on the coordinate system O-x is moved to the light axis center C is given, the following equation is established.

Equation 1

$$x=x'-x_C \;\therefore x'=x+x_C \qquad (1)$$

Here, $x_c$ is a distance between the left end and the light axis center C of the image capturing coordinates, and is a known value.

In addition, apart from the captured image, a coordinate system O-X' relative to the sheet face in the actual space as shown in FIG. 7 is given. It is assumed that, in the coordinate system O-X', the original point is the light axis center C and X' represents an actual distance from the light axis center C. When there is no floating of the paper sheet P, x' coincides with X'. However, if the floating of the paper sheet P occurs, the image on the paper sheet P is apparently expanded in the captured image. Thus, an absolute value of x' in the captured image is greater than an absolute value of X' in the actual paper sheet P as shown in the lower part of FIG. 7.

If X' represents a distance from the light axis center C in the position in which the paper sheet P floats by the floating amount d, the following equation is established from x': X'=l: l−d.

[Equation 2]

$$X'=\frac{l-d}{l}x'=\left(1-\frac{d}{l}\right)x' \;\therefore d=\left(1-\frac{X'}{x'}\right)l$$

On the other hand, the floating amount d of the paper sheet P in the X' coordinate is expressed as follows:

[Equation 3]

$$d=d(X')=\frac{d_{L_2}-d_{L_1}}{2X'_{L_2}}X'+\frac{d_{L_1}+d_{L_2}}{2}$$

Thus, $X'$ is expressed as follows:

[Equation 4]

$$d=\left(1-\frac{X'}{x'}\right)l=\frac{d_{L_2}-d_{L_1}}{2X'_{L_2}}X'+\frac{d_{L_1}+d_{L_2}}{2}$$

$$1-\frac{X'}{x'}=\frac{d_{L_2}-d_{L_1}}{2X'_{L_2}l}X'+\frac{d_{L_1}+d_{L_2}}{2l}$$

$$\left(1+\frac{d_{L_2}-d_{L_1}}{2X'_{L_2}l}x'\right)X'=\left(1-\frac{d_{L_1}+d_{L_2}}{2l}\right)x'$$

$$\therefore X'=\frac{1-\dfrac{d_{L_1}+d_{L_2}}{2l}}{1+\dfrac{d_{L_2}-d_{L_1}}{2X'_{L_2}l}x'}x'=\frac{2X'_{L_2}lx'-(d_{L_1}+d_{L_2})X'_{L_2}x'}{(d_{L_2}-d_{L_1})x'+2X'_{L_2}l}$$

Accordingly, a distance X from the light axis center C on the paper sheet P, which corresponds to the distance x' from the light axis center C in the captured image, is expressed as follows.

[Equation 5]

$$X=\frac{X'}{\cos\beta}=\frac{1}{\cos\beta}\frac{2X'_{L_2}lx'-(d_{L_1}+d_{L_2})X'_{L_2}x'}{(d_{L_2}-d_{L_1})x'+2X'_{L_2}l} \qquad (2)$$

For the above equation, following equations are given.

[Equations 6]

$$d_{L_1}=\left(1-\frac{X'_{L_1}}{x'_{L_1}}\right)l,\; d_{L_2}=\left(1-\frac{X'_{L_2}}{x'_{L_2}}\right)l,$$

-continued $$\beta = \tan^{-1}\frac{d_{L_2} - d_{L_1}}{2X'_{L_2}}$$

In the above equation, since the distance 1 and the distance $X'_{L2}$(=$-X'_{L1}$) are known as the optical system information, and the distance $x'_{L1}$ and the distance $x'_{L2}$ may be obtained as the spot light irradiating position from the image capturing data in step 107 shown in FIG. 6, a position on the actual paper sheet P (X coordinate) corresponding to an arbitrary position of the captured image by the CCD image sensor 67 (x' coordinate) is obtained by calculation using the distance values in step 109 shown in FIG. 6.

In other words, the magnification variation in the fast scan direction of the captured image due to the floating of the paper sheet P may be corrected with the use of the results obtained by reading the individual reflected lights, through the minification optical system, which are derived from the first spot light by the first spot light source 63 and the second spot light by the second spot light source 64 irradiating the transported paper sheet P. This uses the fact that the light receiving position of the first spot light or the second spot light for the CCD image sensor 67 varies in the fast scan direction according to the floating amount of the paper sheet P at the reading position R.

Next, a description will be given for the floating correction and the skew correction for the image capturing data obtained by the CCD image sensor 67 with a specific example.

Figure 8:
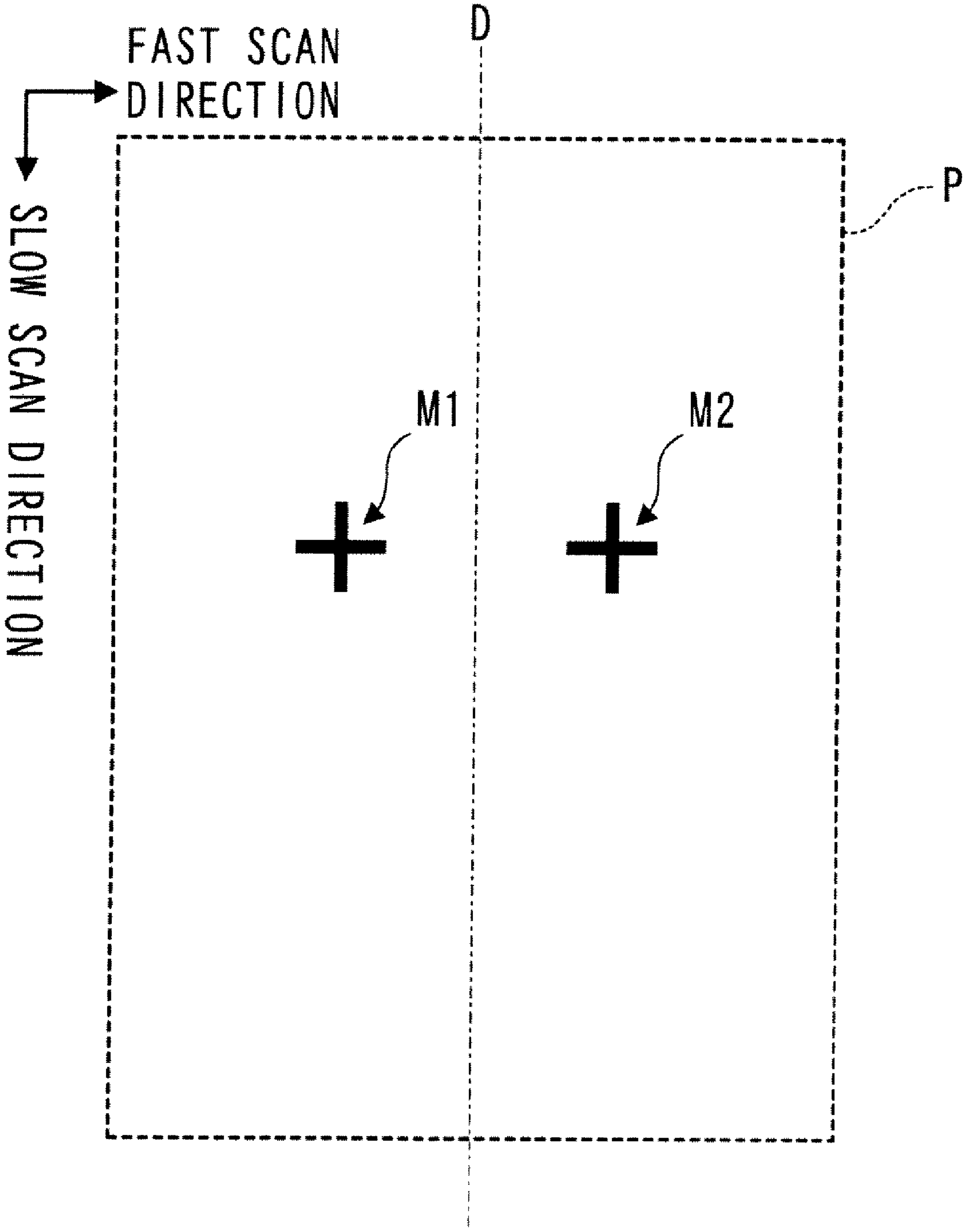
FIG. 8 shows an example of a test image formed on the paper sheet.

FIG. 8 shows an example of a test image formed on the paper sheet P. It should be noted that, here, it is assumed that the paper sheet P subjected to the print registration adjustment is A3 size, and the lateral direction of the paper sheet P is set to the fast scan direction and the longitudinal direction of the paper sheet P is set to the slow scan direction. The test image has a first registration mark M1 and a second registration mark M2. It is assumed that the first registration mark M1 and the second registration mark M2 each have a crisscross shape and are arranged so as to be line symmetry relative to the fast scan direction center D of the paper sheet P.

Figure 9A:
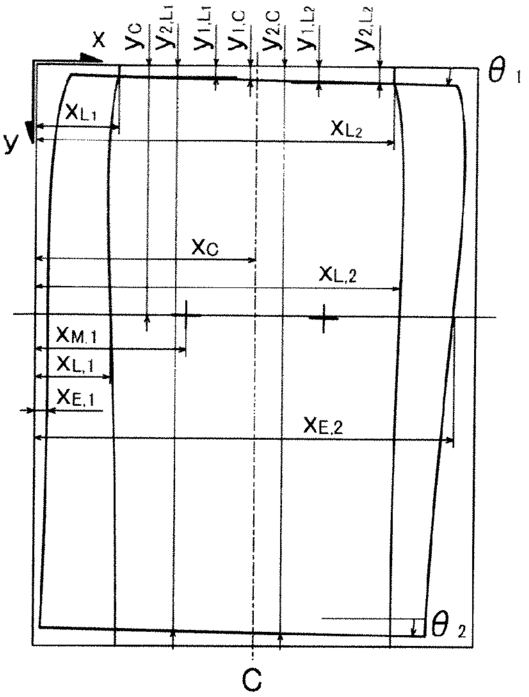
FIGS. 9A to 9D are views for explaining an example of the floating correction and skew correction for the image capturing data obtained by the CCD image sensor.
Figure 9B:
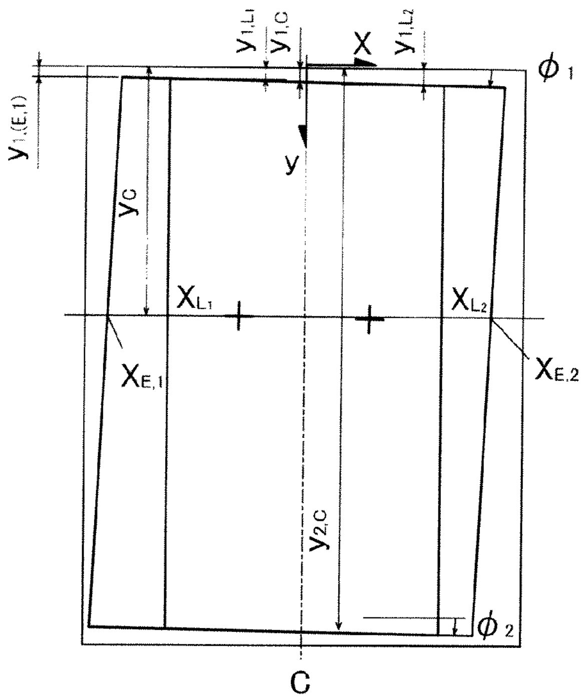
Figure 9C:
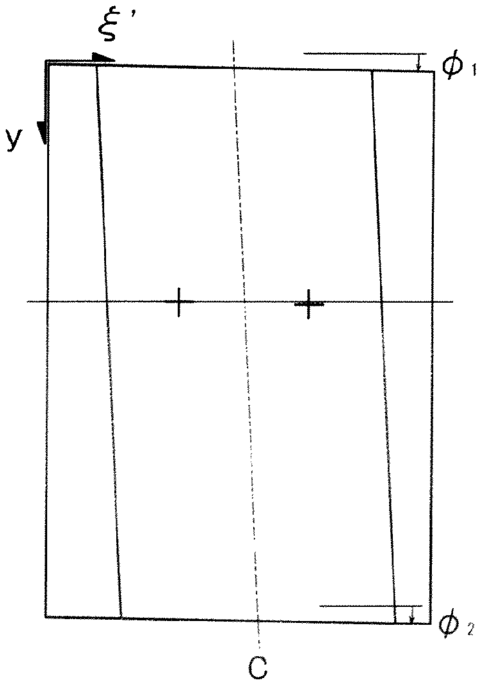
Figure 9D:
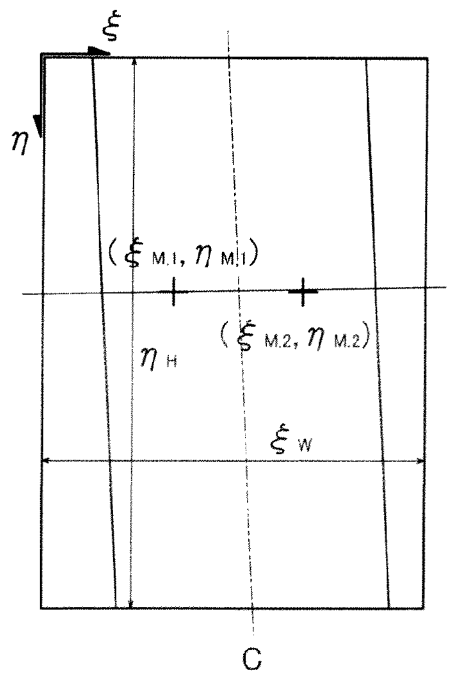

FIGS. 9A to 9D are views for explaining an example of the floating correction and the skew correction for the image capturing data obtained by the CCD image sensor 67. Here, FIG. 9A is a view in which the image capturing data obtained by the CCD image sensor 67 of the image capturing part 60 is expanded on the image capturing coordinates. FIG. 9B is a view showing a state where correction according to the floating of the paper sheet P is made for the image capturing data shown in FIG. 9A. FIG. 9C is a view showing an area corresponding to the paper sheet P extracted from the image capturing data in which the floating has been corrected as shown in FIG. 9B. FIG. 9D is a view in which the image capturing data shown in FIG. 9C is subjected to the skew correction and expanded on the coordinates on the paper sheet.

It should be noted that, in this example, it is assumed that the floating occurs on the front edge side in the transporting direction of the paper sheet P in the reading position R and the paper sheet P is skewed in the right direction. However, when the paper sheet P is transported at a constant speed, the elongation of the captured image in the slow scan direction caused by the floating of the paper sheet P is almost negligible. This is postulated in the following description.

Firstly, as shown in FIG. 9D, coordinates (coordinates on the paper sheet) O-ξη in which the left upper end of the paper sheet P is set to the original point is given.

From the captured image in the image capturing coordinates shown in FIG. 9A, for the skew angle $\theta_1$ at the front edge in the transporting direction of the paper sheet P, the following equation is established, in $y=y_{1,c}$.

[Equation 7]

$$\theta_1 = \tan^{-1}\frac{y_{1,L_2} - y_{1,L_1}}{x_{L_2} - x_{L_1}} \tag{3}$$

Similarly, for the skew angle $\theta_2$ at the rear edge in the transporting direction of the paper sheet P, the following equation is established, in $y=y_{2,c}$.

[Equation 8]

$$\theta_2 = \tan^{-1}\frac{y_{2,L_2} - y_{2,L_1}}{x_{L_2} - x_{L_1}} \tag{4}$$

Further, the skew angle θ at $x=x_c$ in $y=y_c$ is expressed by the following equation, if it is assumed that the skew angle θ continuously changes in the range of $y_{1,c} \leqq y_c \leqq y_{2,c}$.

[Equation 9]

$$\frac{\theta - \theta_1}{\theta_2 - \theta_1} = \frac{y_C - y_{1,C}}{y_{2,C} - y_{1,C}} \tag{5}$$

$$\therefore \theta = \frac{y_C - y_{1,C}}{y_{2,C} - y_{1,C}}(\theta_2 - \theta_1) + \theta_1$$

Here, firstly, the skew correction is examined when the skew angles $\theta_1$ and $\theta_2$ are sufficiently small (for example, 0.1 degree or less). In this case, the influence of the skew on the captured image may be neglected.

Since x coordinate $x_{E,1}$ at the left-side end portion of the paper sheet in $y=y_c$ is obtained from the captured image shown in FIG. 9A, X coordinate $X_{E,1}$ (refer to FIG. 9B) at the left-side end portion of the paper sheet corresponding to $x_{E,1}$ is obtained from the above equations (1) and (2). Here, x coordinate $x_{E,1}$ is extracted as the end position of the paper sheet in step 106 shown in FIG. 6.

In this case, the X coordinate shown in FIG. 9B is assumed to be parallel to the ξ coordinate shown in FIG. D. Thus, the ξ coordinate is expressed as follows:

[Equation 10]

$$\xi = X + X_{E,1} \tag{6}$$

Based on the above-described equation, the ξ coordinate of the coordinate system on the paper sheet shown in FIG. 9D is obtained from an arbitrary x coordinate of the image capturing coordinate system shown in FIG. 9A.

Further, in the captured image shown in FIG. 9A, if a position in the y direction at the light axis center C of the front end portion in the transporting direction of the paper sheet is represented as $y_{1,c}$, η shown in FIG. 9D is expressed as follows.

[Equation 11]

$$\eta = y + y_{1,C}$$

Accordingly, from arbitrary coordinates (x, y) on the image capturing coordinates shown in FIG. 9A, a corresponding coordinates (ξ, η) on the coordinates on the paper sheet are obtained. Therefore, for example, an actual paper-sheet width $\xi_w$, an actual length of the paper sheet $\eta_H$, $(\xi_{M,1}, \eta_{M,1})$ on the coordinates on the paper sheet corresponding to a forming position of the first registration mark M1 on the paper sheet P, and $(\xi_{M,2}, \eta_{M,2})$ on the coordinates on the paper sheet corresponding to a forming position of the second registration mark M2 on the paper sheet P, which are shown in FIG. 9D, are also obtained.

Subsequently, the skew correction is examined when the skew angles $\theta_1$ and $\theta_2$ are increased to a nonnegligible degree.

The skew angle Φ of the paper sheet P in the coordinate system O-Xy shown in FIG. 9B may be obtained in the same manner as the case of the skew angle θ described above by using the equations (3) to (5). However, if the skew angle Φ is changed in the slow scan direction, that is, if rotation occurs, the position on the paper sheet P is difficult to be identified, and thus the paper sheet P is transported so that no such change occurs.

Therefore, the skew angle Φ is assumed to be a fixed value regardless of y. At this time, the following equation is established.

[Equation 12]

$$\phi = \phi_1 = \tan^{-1}\frac{y_{1,L_2} - y_{1,L_1}}{(X_{L_2})_{y=y_{1,L_2}} - (X_{L_1})_{y=y_{1,L_1}}} \tag{7}$$

Next, if x is converted to X using the equations (1) and (2), an image as shown in FIG. 9B is obtained. However, if a skew exists, $d_{L2}$ is indeterminate in the range of $y_{1,L1} \leqq y < y_{1,L2}$, but $d_{L2}$ may be estimated by assuming that β is constant in the range of $y_{1,L1} \leqq y \leqq y_{1,L2}$.

Next, since $x_{E,1}$ of the x coordinate at the left end of the paper sheet P in $y=y_c$ is obtained from the captured image, $X_{E,1}$ may be calculated and it is assumed that $\xi' = X - X_{E,1}$.

[Equations 13]

$$\xi = \frac{\xi'}{\cos\phi},\ \eta = y - y_{1,(E,1)} - \xi\sin\phi$$

From the above equations, the following equation is obtained.

[Equation 14]

$$\xi = \frac{X - X_{E,1}}{\cos\phi},\ \eta = y - y_{1,(E,1)} - (X + X_{E,1})\sin\phi$$

Accordingly, also in this case, from arbitrary coordinates (x, y) on the captured image shown in FIG. 9A, a corresponding coordinates (ξ, η) on the coordinates on the paper sheet are calculated. Therefore, even in the case of a large skew, similarly to the case where a skew is significantly small, an actual paper-sheet width $\xi_w$, an actual length of the paper sheet $\eta_H$, $(\xi_{M,1}, \eta_{M,1})$ on the coordinates on the paper sheet corresponding to a forming position of the first registration mark M1 on the paper sheet P, and $(\xi_{M,2}, \eta_{M,2})$ on the coordinates on the paper sheet corresponding to a forming position of the second registration mark M2 on the paper sheet P are obtained.

As described above, in the first exemplary embodiment, an image formed on the paper sheet P and an optical image formed by a spot light are obtained as image capturing data by irradiating the transported paper sheet P with the first spot light and the second spot light. Then, a correction is made for the magnification variation in the fast scan direction of the image capturing data due to the floating of the paper sheet P at the reading position R by using the spot light irradiating positions of the first spot light and the second spot light extracted from the resulting image capturing data. In addition, a correction is made for the distortion of the image capturing data due to a skew of the paper sheet P at the reading position R by using the paper sheet end position extracted from the resulting image capturing data. By so doing, the forming position of a test image (registration mark) relative to the paper sheet P is accurately recognized. Image formation is performed at a desired position of the paper sheet P by performing print registration adjustment using the results.

Figure 10:
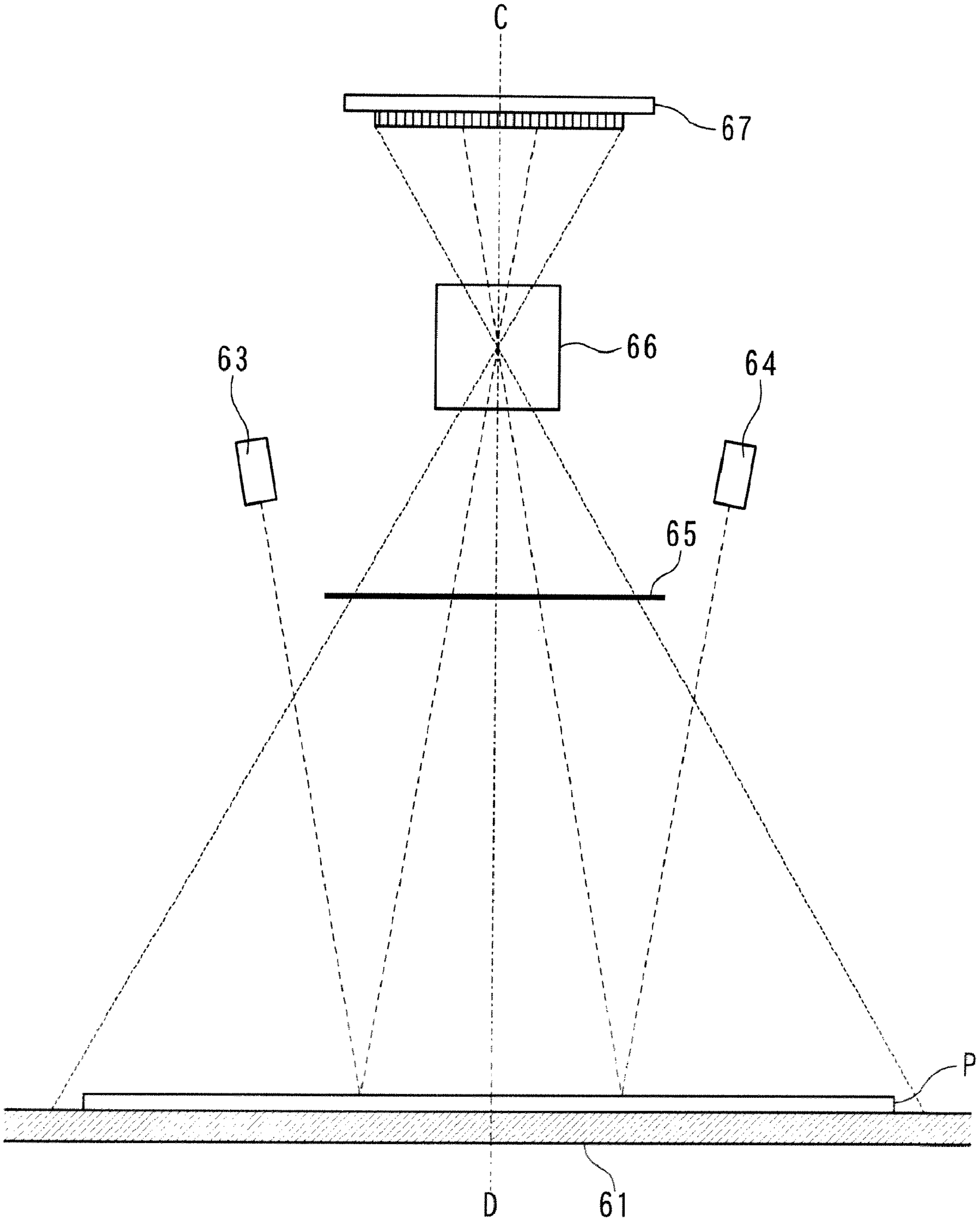
FIG. 10 is a view showing an arrangement example of the first spot light source and the second spot light source.

It should be noted that, in the first exemplary embodiment, with the first spot light from the first spot light source 63 and the second spot light from the second spot light source 64, the guiding member 61 is irradiated from a direction perpendicularly to the fast scan direction and the slow scan direction, but the present invention is not limited to this. For example, as shown in FIG. 10 (a view showing an arrangement example of the first spot light source 63 and the second spot light source 64), with the spot light, the guiding member 61 may be irradiated from a direction perpendicularly to the slow scan direction and obliquely to the fast scan direction. In this case, when the floating of the paper sheet P occurs, the variation amount of the light receiving position of the CCD image sensor 67 is larger than in the first exemplary embodiment, and the detection sensitivity of the floating of the paper sheet P is further increased.

In addition, in the first exemplary embodiment, the paper sheet P is irradiated with two spot lights, but only one spot light may be enough. Further, the paper sheet P may be irradiated with three or more spot lights.

Furthermore, in the first exemplary embodiment, a laser light source is used as the first spot light source 63 and the second spot light source 64, but for example, a light emitted from the light source such as a light emitting diode (LED) and the like and then condensed by a lens may be used.

<Second Exemplary Embodiment>

Figure 11A:
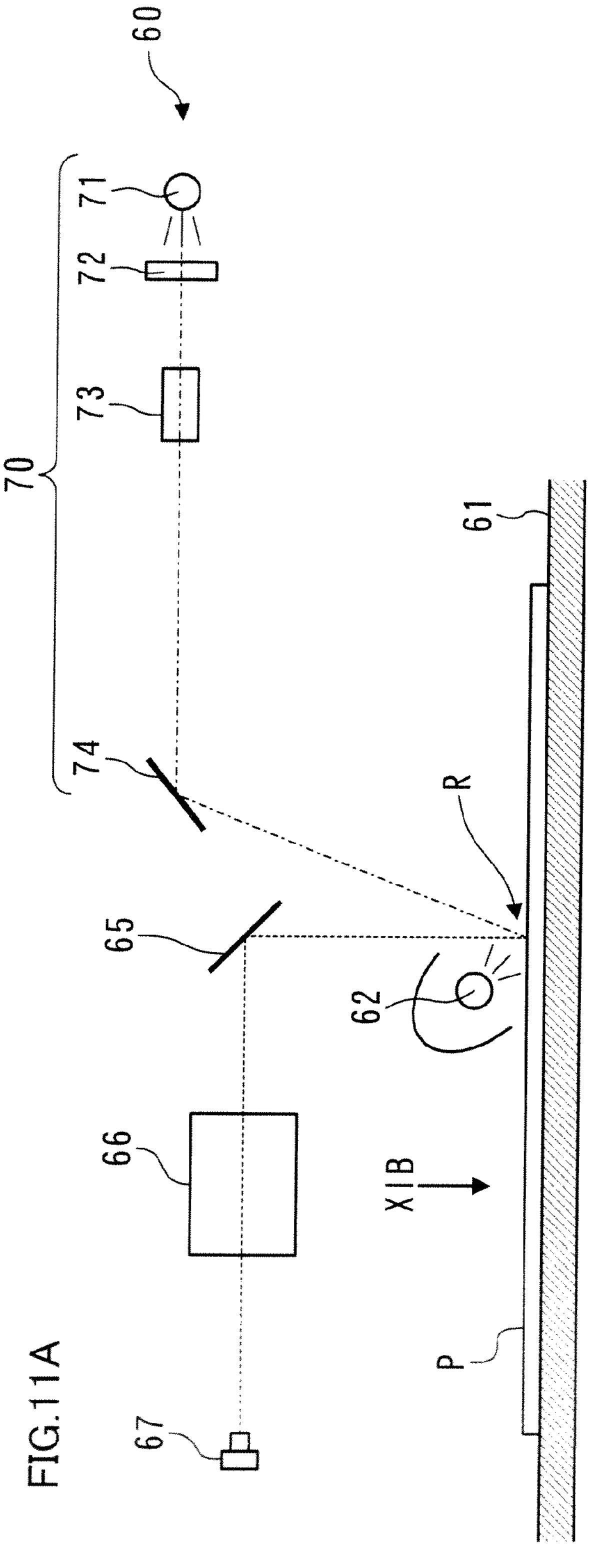
FIGS. 11A and 11B are views for explaining a configuration of the image capturing part according to the second exemplary embodiment.
Figure 11B:
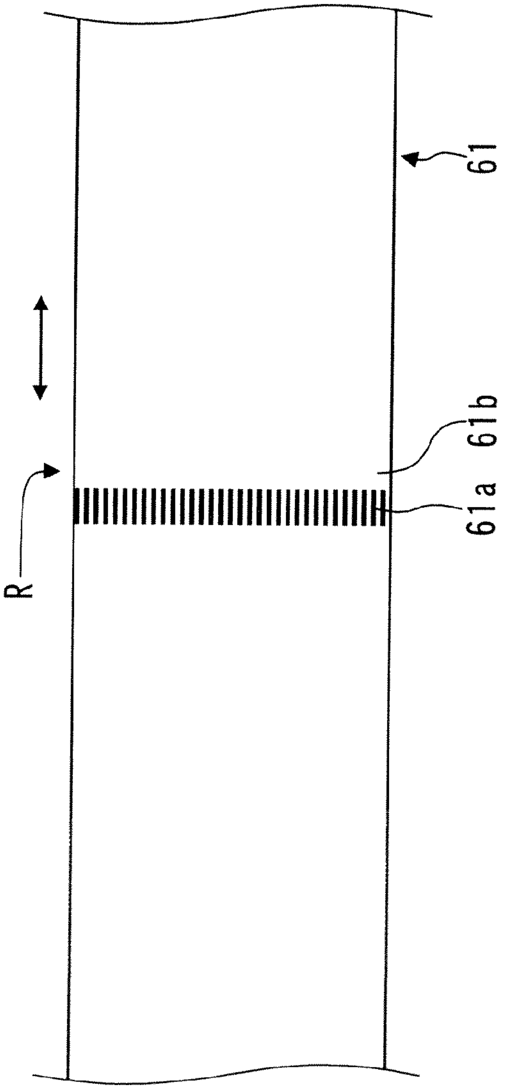

FIGS. 11A and 11B are views for explaining a configuration of the image capturing part 60 according to the second exemplary embodiment. Here, FIG. 11A is a view of the image capturing part 60 seen from the front side of the paper in FIG. 1. FIG. 11B is a view of the guiding member 61 shown in FIG. 11A, which is seen from a XIB direction of FIG. 11A. In FIGS. 11A and 11B, a paper sheet P is transported from the left side to the right side. It should be noted that, since the configuration of the image forming apparatus in which the image capturing part 60 is equipped is the same as that described in the first exemplary embodiment (refer to FIG. 1), the detailed description thereof is omitted.

Figure 12:
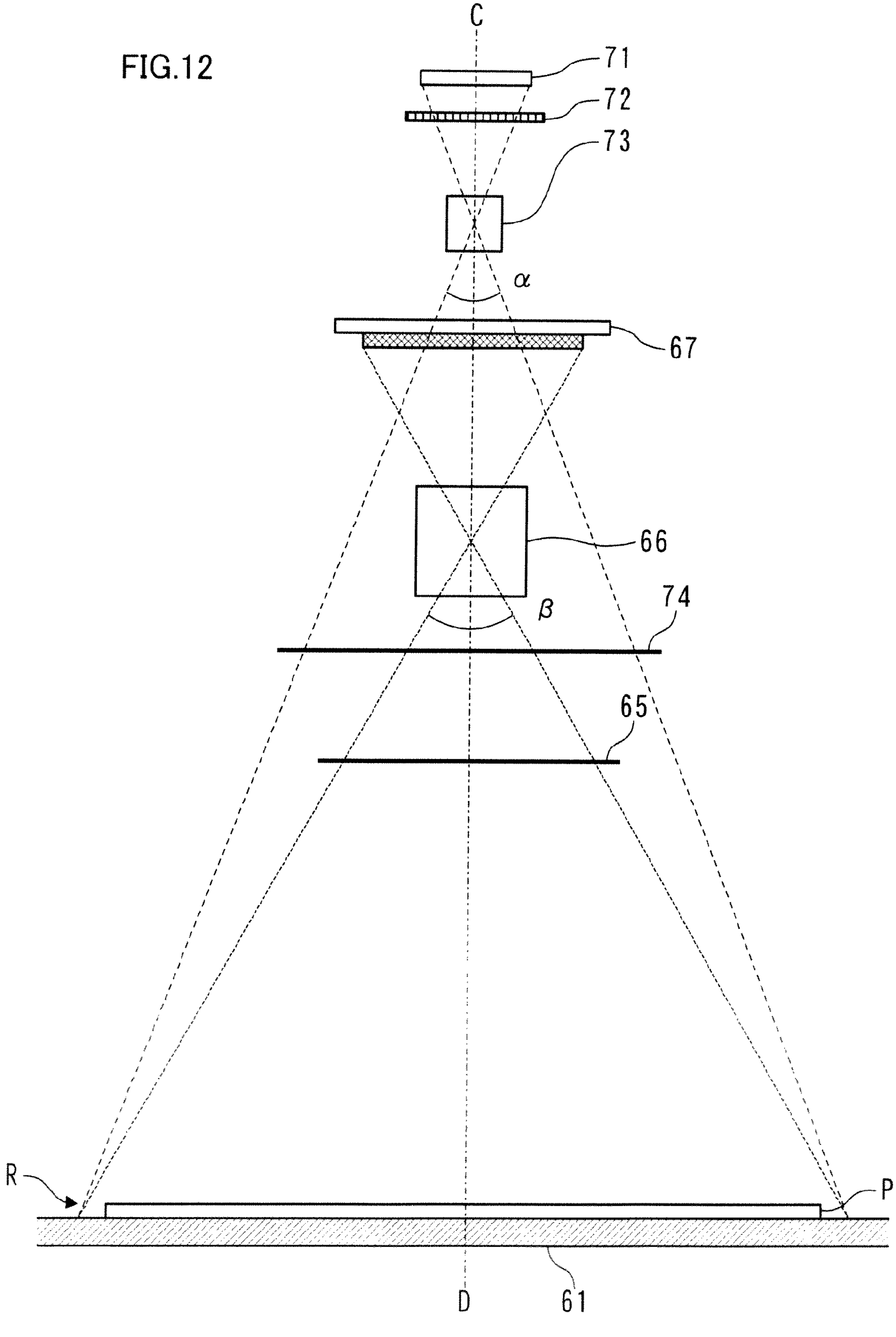
FIG. 12 is a view showing an image capturing light path of the image capturing part seen from the fast scan direction on a plane surface.

FIG. 12 is a view showing an image capturing light path of the image capturing part 60 seen from the fast scan direction on a plane surface. In FIG. 12, the paper sheet P is transported from the back side to the front side in the figure. It should be noted that a light source for image capture 62 is not shown in FIG. 12.

The basic configuration of the image capturing part 60 is basically the same as that explained in the first exemplary embodiment. However, in the second exemplary embodiment, the guiding member 61 is arranged movably in the slow scan direction, and, in addition, a grid background portion 61*a* and a white background portion 61*b* are provided on the guiding member 61. Further, the image capturing part 60 in the second exemplary embodiment is equipped with a position mark projector 70 in place of the first spot light source 63 and the second spot light source 64.

Here, the grid background portion 61*a* provided on the guiding member 61 is formed by alternately arranging plural white portions colored in white and black portions colored in black at regular intervals in the fast scan direction. The white background portion 61*b* is formed by white portions colored in white. In the second exemplary embodiment, the grid background portion 61*a* or the white background portion 61*b* is selectively arranged at the reading position R by moving the guiding member 61 in the slow scan direction by using the driving part which is not shown.

Further, the position mark projector 70, which functions as an optical image forming unit or a second irradiating unit, is provided with a white light source 71 that emits a white light, a grid plate 72 arranged to face the white light source 71, a lens 73 that condenses light passing through the grid plate 72, and a mirror 74 for reflecting the light passing through the lens 73 toward the reading position R.

Here, the grid plate 72 is constituted by alternately arranging plural transmission portions for transmitting the light emitted from the white light source 71 and plural blocking portions for blocking the light emitted from the white light source 71 at regular intervals in the fast scan direction. Therefore, when the white light source 71 is turned on, a light and dark shadow according to the transmission portion and the blocking portion formed in the grid plate 72 is projected on the paper sheet P transported on the guiding member 61. It should be noted that, in the following description, the light and dark shadow (an optical image) projected on the paper sheet P by the position mark projector 70 is called as a position mark. At this time, since the position mark projector 70 is provided with the lens 73, the light passing through the grid plate 72 is projected in a magnified state on the paper sheet P through the lens 73, as shown in FIG. 12.

Further, in the second exemplary embodiment, as is clear from FIG. 12, a projection angle α of a light with which the white light source 71 irradiates the paper sheet P through the grid plate 72, the lens 73, and the mirror 74 is set to be smaller than an angle of view P of a light which is received by the CCD image sensor 67 from the paper sheet P through the mirror 65 and the lens 66. That is, in the second exemplary embodiment, an angle of field is differentiated between the irradiation system and the light receiving system in the image capturing part 60.

Furthermore, even in the second exemplary embodiment, like the first exemplary embodiment, a test image is formed with respect to the paper sheet P by the image forming unit 30, the test image formed on the paper sheet P is directly read by the image capturing part 60, the print registration adjustment of the paper sheet P is performed based on the reading results, and thus the forming position of an image relative to the paper sheet P is adjusted.

In addition, on this occasion, the forming position of the test image relative to the paper sheet P is accurately obtained by performing correction for the floating or skew of the paper sheet P on the reading results of the test image, that is, a captured image (image capturing data) by the CCD image sensor 67. Especially, in the second exemplary embodiment, the floating of the paper sheet P at the reading position is recognized by using the results obtained by reading, with the CCD image sensor 67, the projected light (the position mark) with which the above-described position mark projector 70 irradiates the paper sheet P. Hereinafter, this will be described in detail.

Figure 13:
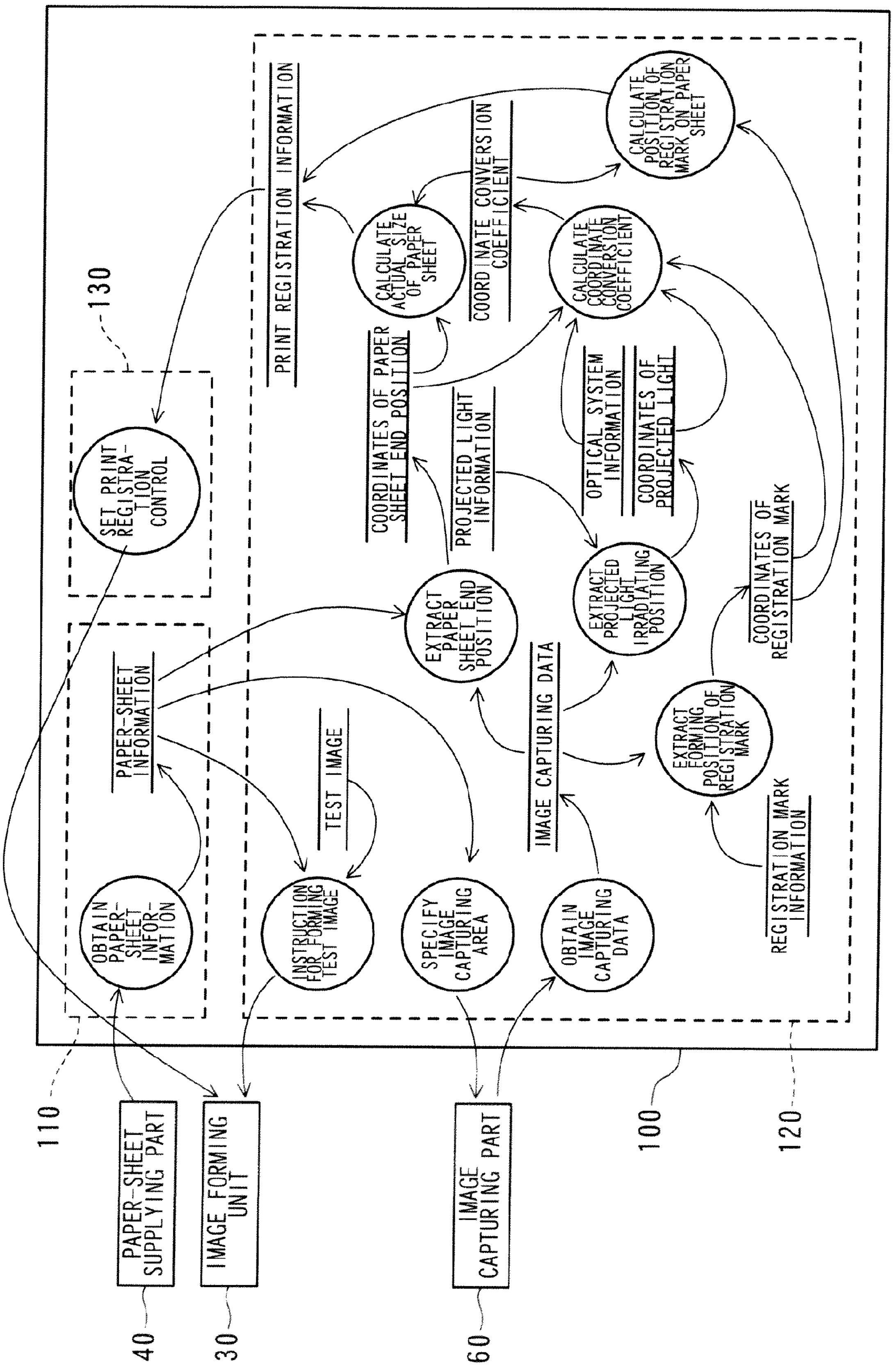
FIG. 13 is a diagram showing the functional blocks of the controller and a data flow in the controller.

FIG. 13 is a diagram showing the functional blocks of the controller 100 and a data flow in the controller 100. It should be noted that, the functions relating to the print registration adjustment operation are extracted from various kinds of functions of the controller 100 and shown in FIG. 13.

Similarly to the first exemplary embodiment, the controller 100 is provided with a paper-sheet information management portion 110, a print registration information generation portion 120, and a print registration setting portion 130. However, in the print registration information generation portion 120, a part of a function is different from that in the first exemplary embodiment. The detailed description will be described later.

First, a description will be given for a set-up operation performed before an image on a paper sheet P is read out in the image capturing part 60, with reference to a flowchart shown in FIG. 14. It should be noted that, the set-up operation is executed by the controller 100 shown in FIG. 13.

Figure 14:
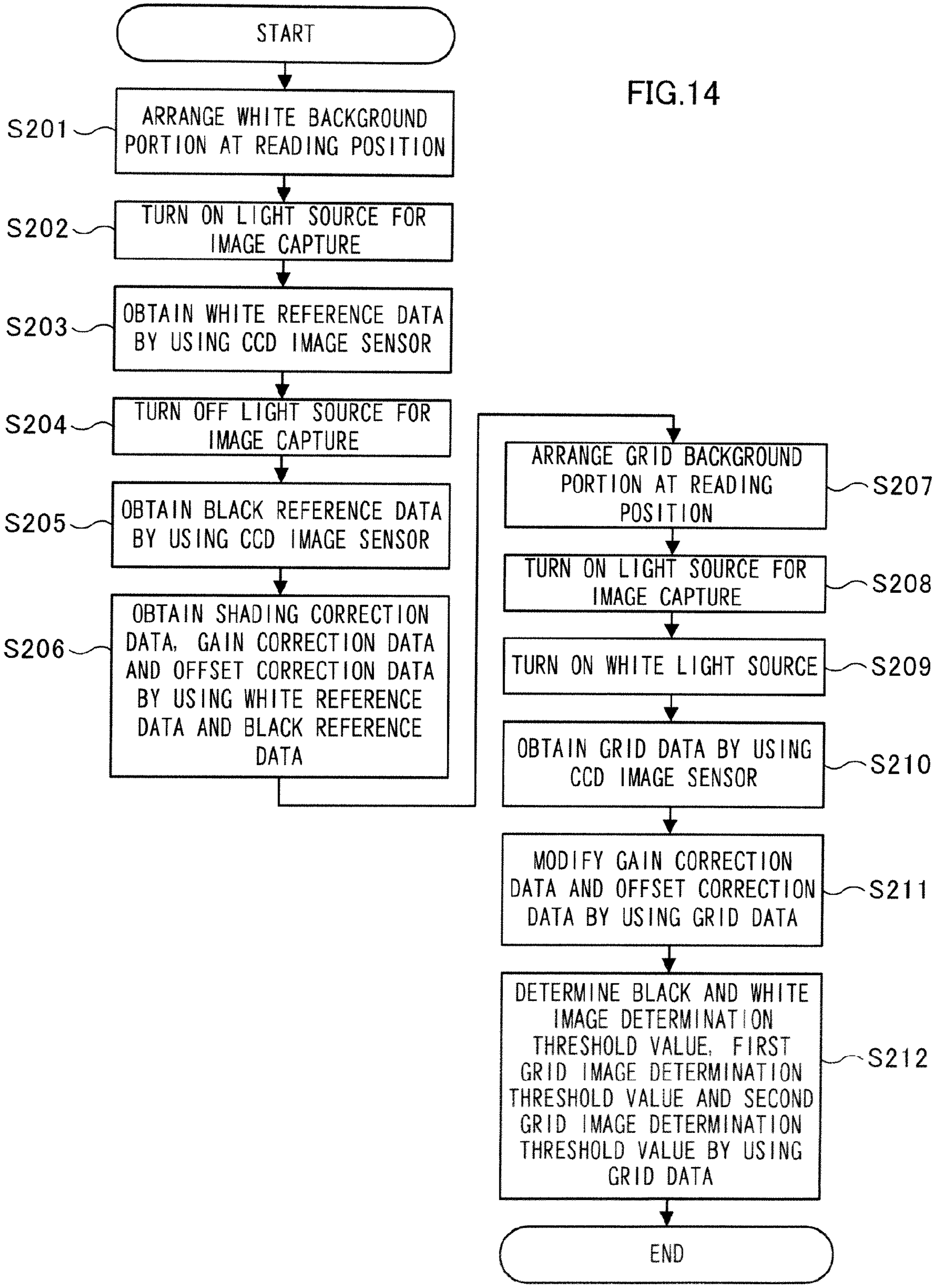
FIG. 14 is a flowchart for explaining a flow of the set-up operation performed before an image on a paper sheet is read out in the image capturing part.

FIG. 14 is a flowchart for explaining a flow of the set-up operation performed before an image on a paper sheet P is read out in the image capturing part 60.

In the set-up operation, first, the guiding member 61 is moved in the slow scan direction so that the white background portion 61*b* is arranged at the reading position R (step 201). Subsequently, the light source for image capture 62 is turned on (step 202), and the light source for image capture 62 uniformly irradiates, with white light, the white background portion 61*b* arranged at the reading position R in the fast scan direction. Next, the CCD image sensor 67 receives reflected light of the light with which the light source for image capture 62 irradiates the white background portion 61*b*, in the fast scan direction, and obtains white reference data (step 203). Then, the light source for image capture 62 is turned off (step 204). Subsequently, the CCD image sensor 67 obtains black reference data in a state where the light source for image capture 62 does not irradiate the white background portion 61*b* with the white light (step 205). After that, by using the white reference data obtained in step 203 and the black reference data obtained in step 205, shading correction data, gain correction data and offset correction data for respective pixels of the CCD image sensor 67 are obtained (step 206).

Next, the guiding member 61 is moved in the slow scan direction so that the grid background portion 61*a* is arranged at the reading position R (step 207). Subsequently, the light source for image capture 62 is turned on (step 208), the white light source 71 is also turned on (step 209), the light source for image capture 62 uniformly irradiates, with the white light, the reading position R in the fast scan direction, and the white light source 71 irradiates the reading position R with a projected light through the grid plate 72, the lens 73 and the like. Then, the CCD image sensor 67 receives, in the fast scan direction, reflected light of the light with which the light source for image capture 62 and the white light source 71 irradiate the grid background portion 61*a*, and obtains grid data (step 210). Further, by using the grid data obtained in step 210, the gain correction data and the offset correction data that have been acquired in step 206 are modified so as not to saturate the maximum levels of the respective pixels (step 211). Furthermore, by using the grid data obtained in step 210, a black and white image determination threshold value, a first grid image determination threshold value and a second grid image determination threshold value are determined (step 212). The black and white image determination threshold value, the first grid image determination threshold value and the second grid image determination threshold value are used for identifying four-step lightness, and they have a relationship in which the first grid image determination threshold value is less than the black and white image determination threshold value and the black and white image determination threshold value is less than the second grid image determination threshold value.

Figure 15:
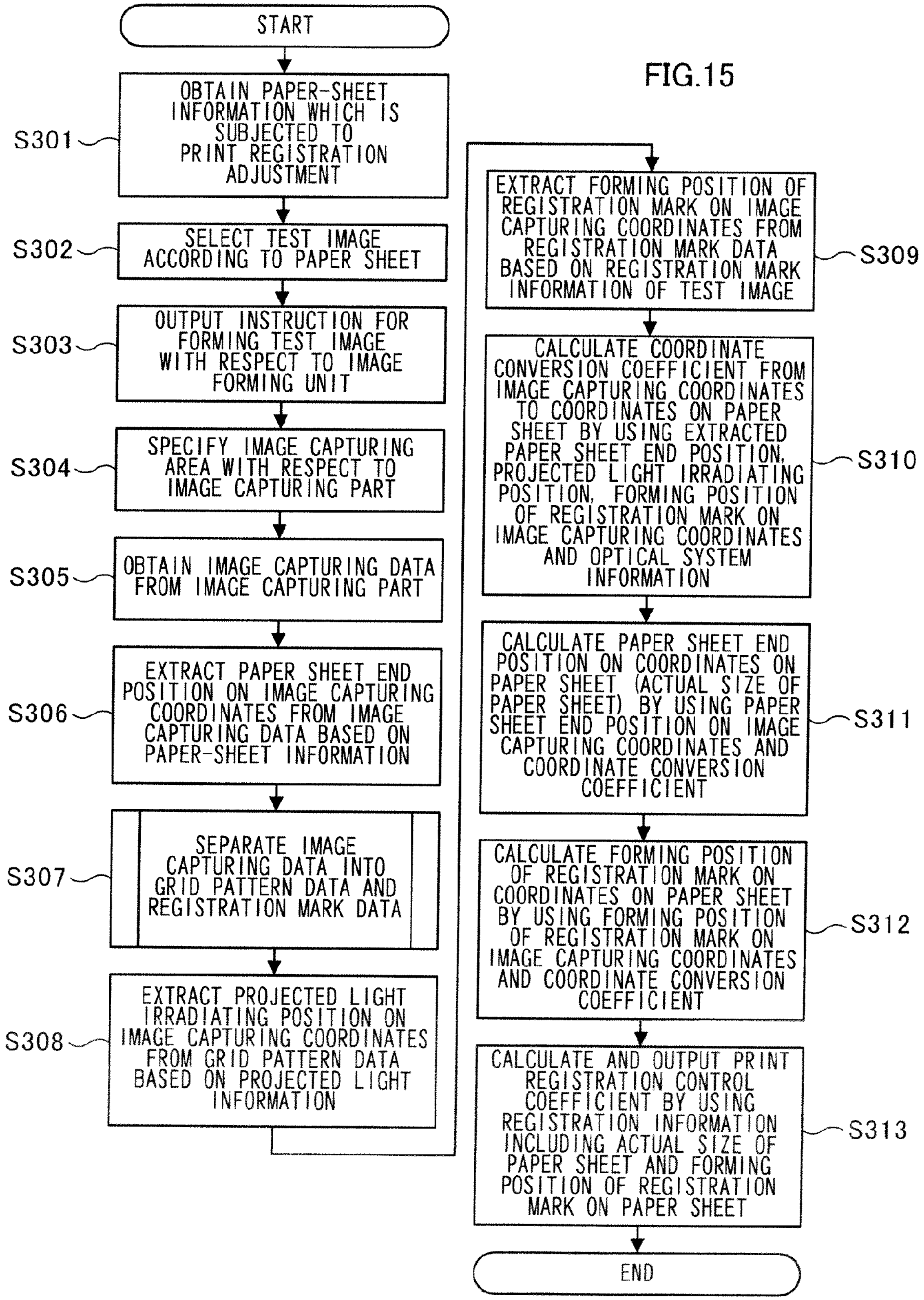
FIG. 15 is a flowchart for explaining a processing flow in the print registration adjustment operation according to the second exemplary embodiment.

A processing flow in the print registration adjustment operation is described with reference to FIG. 13 and a flowchart shown in FIG. 15. FIG. 15 is a flowchart for explaining a processing flow in the print registration adjustment operation according to the second exemplary embodiment. This processing is started by receiving an execution instruction of print registration adjustment from a user interface or the like which is not shown in the figure.

In the controller 100 receiving the execution instruction of print registration adjustment, first, the paper-sheet information management portion 110 obtains paper-sheet information of a paper sheet P which is subjected to the print registration adjustment (step 301). Here, the paper-sheet information is related to a size or a direction of the paper sheet P stored in the paper-sheet storage portion 41 of the paper-sheet supplying part 40, and the paper-sheet information management portion 110 has access to the paper-sheet storage portion 41 to obtain the paper-sheet information of the stored paper sheet P, and holds it in an internal memory.

Next, the print registration information generation portion 120 refers to the paper-sheet information held in the paper-sheet information management portion 110, selects a test image according to the paper sheet P (step 302), and outputs an instruction for forming the test image with respect to the image forming unit 30 (step 303). Here, the test image includes a registration mark described later, and plural kinds of test images are prepared in advance according to a size and a direction of a paper sheet P, and stored in a memory. Subsequently, the print registration information generation portion 120 specifies an image capturing area according to the paper-sheet information with respect to the image capturing part 60 (step 304).

Thereafter, in the above image forming process, a test image is formed by the image forming unit 30 and the test image is transferred and fixed on the paper sheet P supplied from the a paper-sheet supplying part 40. While the paper sheet P and the test image formed on the paper sheet P are transported, they are captured by the image capturing part 60. At this time, in the image capturing part 60, while the light source for image capture 62 irradiates, with light for image capture, the test image forming face of the paper sheet P passing through the reading position R, the position mark projector 70 irradiates the grid-shaped position mark. Then, the CCD image sensor 67 receives reflected light from the paper sheet P at the reading position R through the mirror 65 and the lens 66. By so doing, image capturing data for one line in the fast scan direction of the paper sheet P is obtained, and this process is sequentially performed over the whole area in the slow scan direction of the transported paper sheet P to obtain image capturing data for one paper sheet P. It should be noted that, the image capturing data also include image capturing data of an outside of end portions of the paper sheet P. This is to securely obtain the data of the whole area of the paper sheet P and to utilize the end positions of the paper sheet P for skew correction described later.

Subsequently, the print registration information generation portion 120 obtains the image capturing data for one paper sheet P from the image capturing part 60 (step 305). It should be noted that, the obtained image capturing data are stored in the memory.

Next, the print registration information generation portion 120 extracts a paper sheet end position on image capturing coordinates from the image capturing data, based on the paper-sheet information read out from the paper-sheet information management portion 110 (step 306). Then, the resulting data of the paper sheet end position is stored in the memory. Subsequently, the print registration information generation portion 120 separates the image capturing data into grid pattern data projected on the paper sheet P by the position mark projector 70 and registration mark data formed on the paper sheet P (step 307). The separation processing will be described in detail later. Then, the print registration information generation portion 120 extracts a projected light irradiating position on the image capturing coordinates from the grid pattern data, based on projected light information held in the inside (step 308). Here, the projected light information includes the position, the intervals, the number, and the like of the position mark formed on the paper sheet P by the position mark projector 70 according to a size and a direction of the paper sheet P, and stored in the memory in advance. Further, the print registration information generation portion 120 extracts a forming position of a registration mark on the image capturing coordinates from the registration mark data, based on the registration mark information of the test image (step 309). Here, the registration mark information includes the number, a position, a color, a shape and the like of the registration mark contained in the test image determined according to the size and the direction of the paper sheet P, and is stored in the memory in advance.

Then, the print registration information generation portion 120 calculates a coordinate conversion coefficient from the image capturing coordinates to the coordinates on the paper sheet by using the paper sheet end position extracted in the above step 306, the projected light irradiating position extracted in step 308, the forming position of the registration mark extracted in step 309 and the optical system information (step 310). Here, the optical system information includes various kinds of information on the optical system of the image capturing part 60, such as, a distance from CCD image sensor 67 to the lens 66, a distance from the lens 66 to the paper-sheet transportation path, further specifications of the CCD image sensor 67 and the like, and is stored in the memory in advance.

Next, the print registration information generation portion 120 calculates the paper sheet end position on the coordinates on the paper sheet, that is, an actual size of the paper sheet P by using the paper sheet end position on the image capturing coordinates extracted in the above step 306 and the coordinate conversion coefficient calculated in the above step 310 (step 311). The resulting data of the actual size of the paper sheet P are stored in the memory. Subsequently, the print registration information generation portion 120 calculates the forming position of the registration mark on the coordinates on the paper sheet, that is, on the paper sheet P, by using information on the forming position of the registration mark on the image capturing coordinates extracted in the above step 309 and the coordinate conversion coefficient calculated in the above step 310 (step 312). The resulting data of the forming position of the registration mark on the paper sheet P are stored in the memory. It should be noted that both information on the actual size of the paper sheet P calculated in the above step 311 and information on the forming position of the registration mark on the paper sheet P calculated in the above step 312 become the above-described print registration information.

In order to recognize the actual forming position of the registration mark relative to the paper sheet P with reference to the print registration information prepared by the print registration information generation portion 120 and correct the difference with the target forming position of the registration mark, the print registration setting portion 130 calculates timing of supplying the paper sheet P at the paper-sheet supplying part 40, a contact condition between the intermediate transfer belt 21 and the secondary transfer roll 25 at the secondary transfer unit of the image forming unit 30, and further a print registration control coefficient relating to a transportation speed of the paper sheet P and the like, and outputs them to the imaging forming unit 30 and the a paper-sheet supplying part 40 (step 313). Thereafter, the image forming unit 30 resets parameters of each configuration according to the inputted print registration control coefficient and is prepared for the subsequent image forming operation under the condition where the print registration adjustment is performed.

Figure 16:
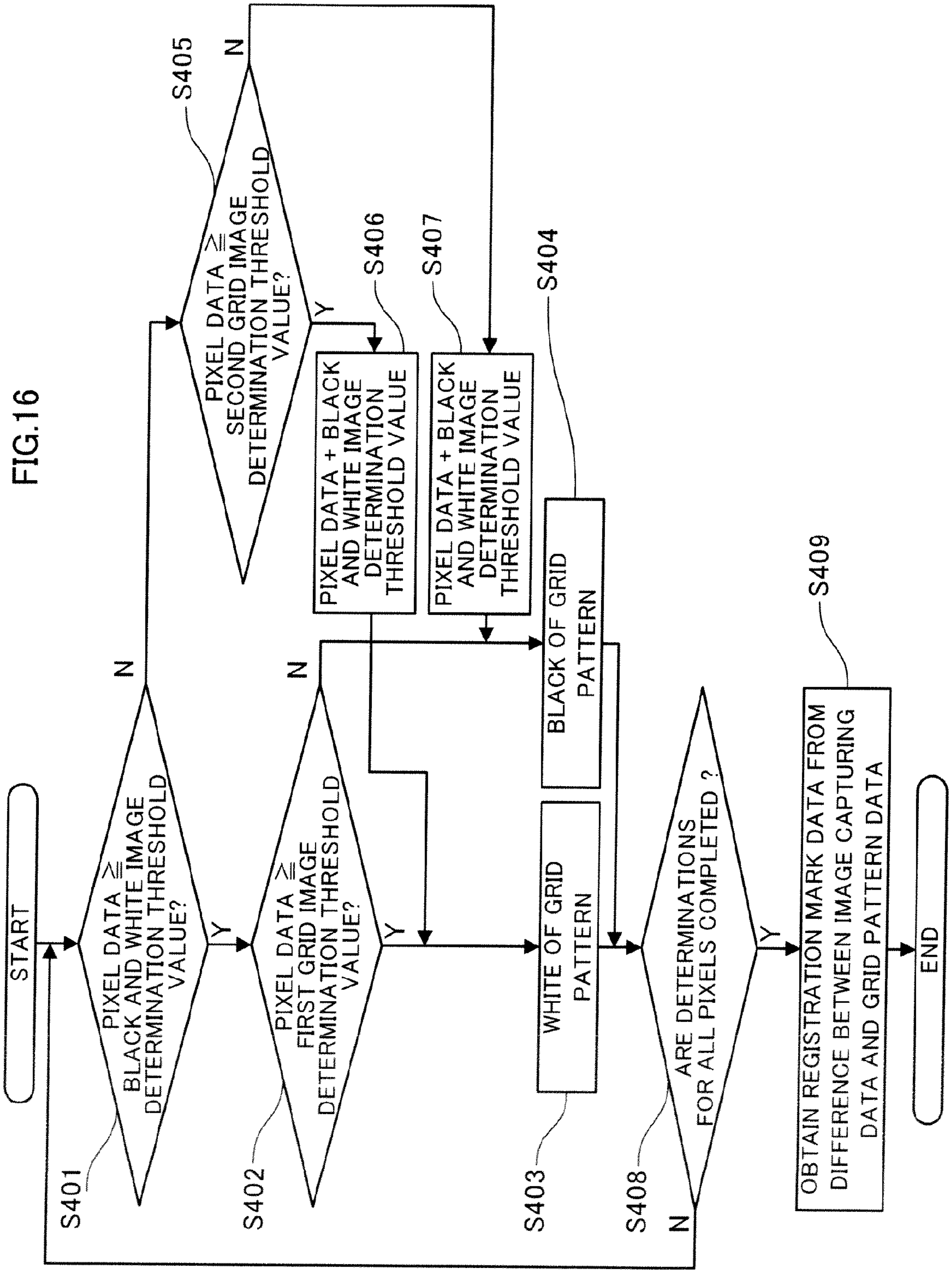
FIG. 16 is a flowchart for explaining a processing flow for separating the obtained image capturing data into the grid pattern data and the registration mark data in the print registration adjustment operation.

Next, the separation process in the above step 307 is described with reference to the flowchart shown in FIG. 16. FIG. 16 is a flowchart for explaining a processing flow for separating the obtained image capturing data into the grid pattern data and the registration mark data in the print registration adjustment operation. The processing is performed for each pixel of the obtained image capturing data in the print registration information generation portion 120.

Firstly, the print registration information generation portion 120 determines whether the pixel data of predetermined pixels constituting the image capturing data have the black and white image determination threshold value or more (step 401). It should be noted that, the black and white image determination threshold value is predetermined in step 212 shown in FIG. 14.

If the print registration information generation portion 120 determined that the pixel data have the black and white image determination threshold value or more in step 401, then it determines whether or not the pixel data have the first grid image determination threshold value or more (step 402). It should be noted that, the first grid image determination threshold value is also predetermined in step 212 shown in FIG. 14. If the print registration information generation portion 120 determines that the pixel data have the first grid image determination threshold value or more in step 402, it determines that the pixel data form a white of the grid pattern (step 403). On the other hand, if the print registration information generation portion 120 determines that the pixel data have less than the first grid image determination threshold value in step 402, it determines that the pixel data form a black of the grid pattern (step 404).

Further, if the print registration information generation portion 120 determines that the pixel data have less than the black and white image determination threshold value in the above step 401, then it determines whether or not the pixel data have the second grid image determination threshold value or more (step 405). It should be noted that, the second grid image determination threshold value is also predetermined in step 212 shown in FIG. 14. If the print registration information generation portion 120 determines that the pixel data have the second grid image determination threshold value or more in step 405, it rewrites the pixel data into new pixel data of the pixel by adding the black and white image determination threshold value to the pixel data (step 406) and then determines that the pixel data form a white of the grid pattern (step 403). On the other hand, if the print registration information generation portion 120 determines that the pixel data have less than the second grid image determination threshold value in step 405, it rewrites the pixel data into new pixel data of the pixel by adding the black and white image determination threshold value to the pixel data (step 407), and then determines that the pixel data form a black of the grid pattern (step 404). The grid pattern data (white or black) with respect to the pixels are obtained by carrying out such a determination processing.

Furthermore, after performing the determination in the above step 403 and step 404, the print registration information generation portion 120 determines whether the determinations for all pixels are completed or not (step 408). If the print registration information generation portion 120 determines that the determinations for all pixels are not completed in step 408, the process returns to step 401 to perform the similar processing for the pixel data of the next pixels. On the other hand, if the print registration information generation portion 120 determines that the determinations for all pixels are completed in step 408, that is, if the grid pattern data for all pixels are obtained, it calculates the difference between the original image capturing data and the resulting grid pattern data for each pixel, and as the result, registration mark data are obtained (step 409). By so doing, the image capturing data are separated into the grid pattern data and the registration mark data.

Here, a description will be given for a relationship between a floating amount of the paper sheet P and a forming position of the position mark (a projected-light forming position), which is obtained by reading, with the CCD image sensor 67, the position mark projected on the paper sheet P, with reference to FIG. 17.

Figure 17:
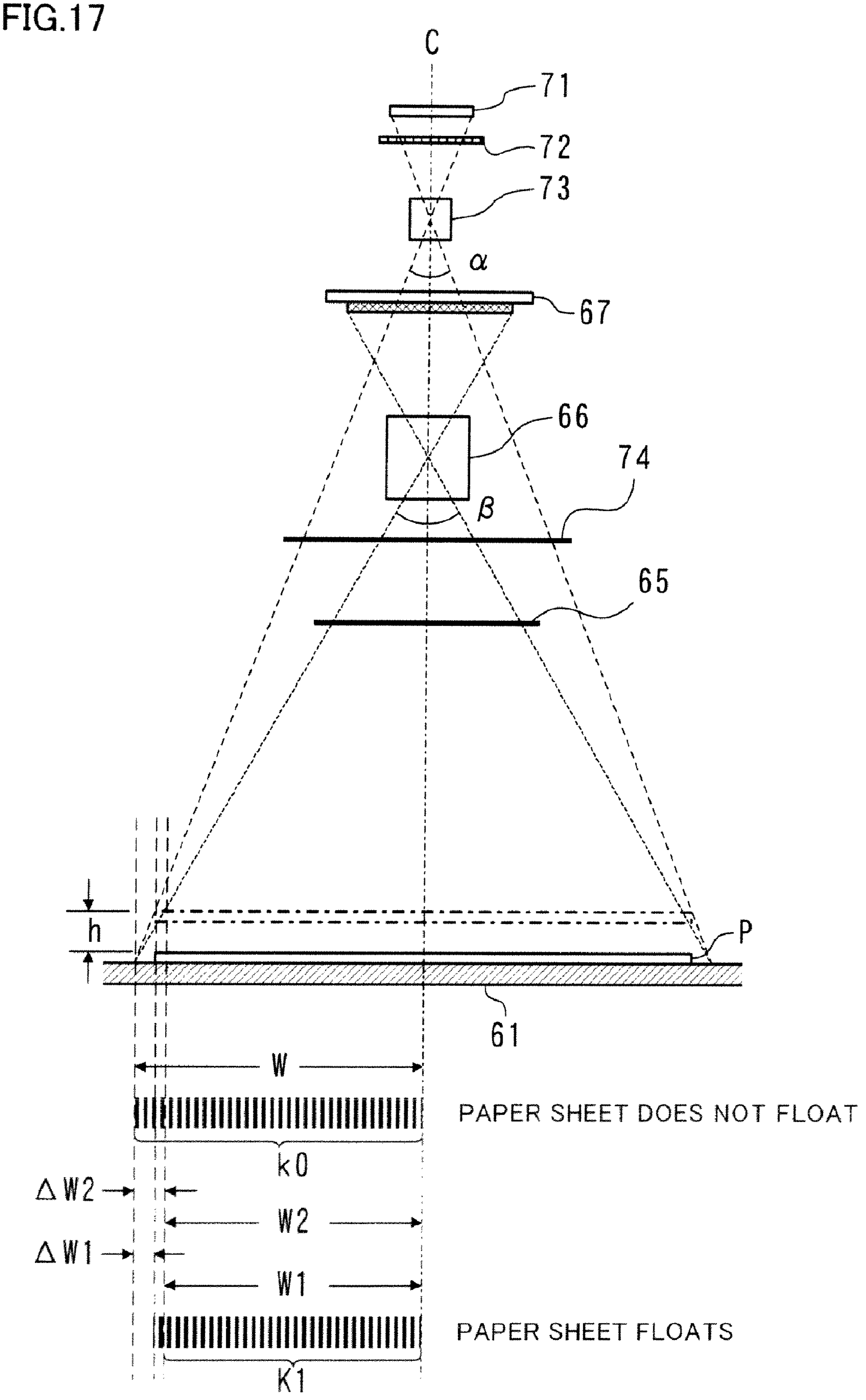
FIG. 17 is a view for explaining the relationship between the floating amount of the paper sheet and a forming position of the position mark (a projected-light forming position), which is obtained by reading, with the CCD image sensor, the position mark projected on the paper sheet.

In the case where the transported paper sheet P does not float, which is indicated as solid lines in FIG. 17, the number of the captured grid patterns between the central pixel corresponding to the light axis center C of the CCD image sensor 67 and a predetermined pixel on the end portion side in the fast scan direction is k0. In the case where the transported paper sheet P floats by a floating amount h, which is indicated as dashed-dotted lines in FIG. 17, the number of the captured grid patterns between the central pixel corresponding to the light axis center C of the CCD image sensor 67 and a predetermined pixel on the end portion side in the fast scan direction is k1. Here, k0 is greater than k1.

The read-out width between the central pixel corresponding to the light axis center C of the CCD image sensor 67 and a pixel corresponding to an end portion in the fast scan direction is symbolized as W. Here, the relationship of the geometrical positions in the image capturing light path is as follows:

$$\Delta W1 = h/\tan\beta$$

$$\Delta W2 = h/\tan\alpha$$

$$W1 = W - \Delta W1$$

$$W2 = W - \Delta W2$$

$$k1 = k0 \times W2/W1$$

Figure 18:
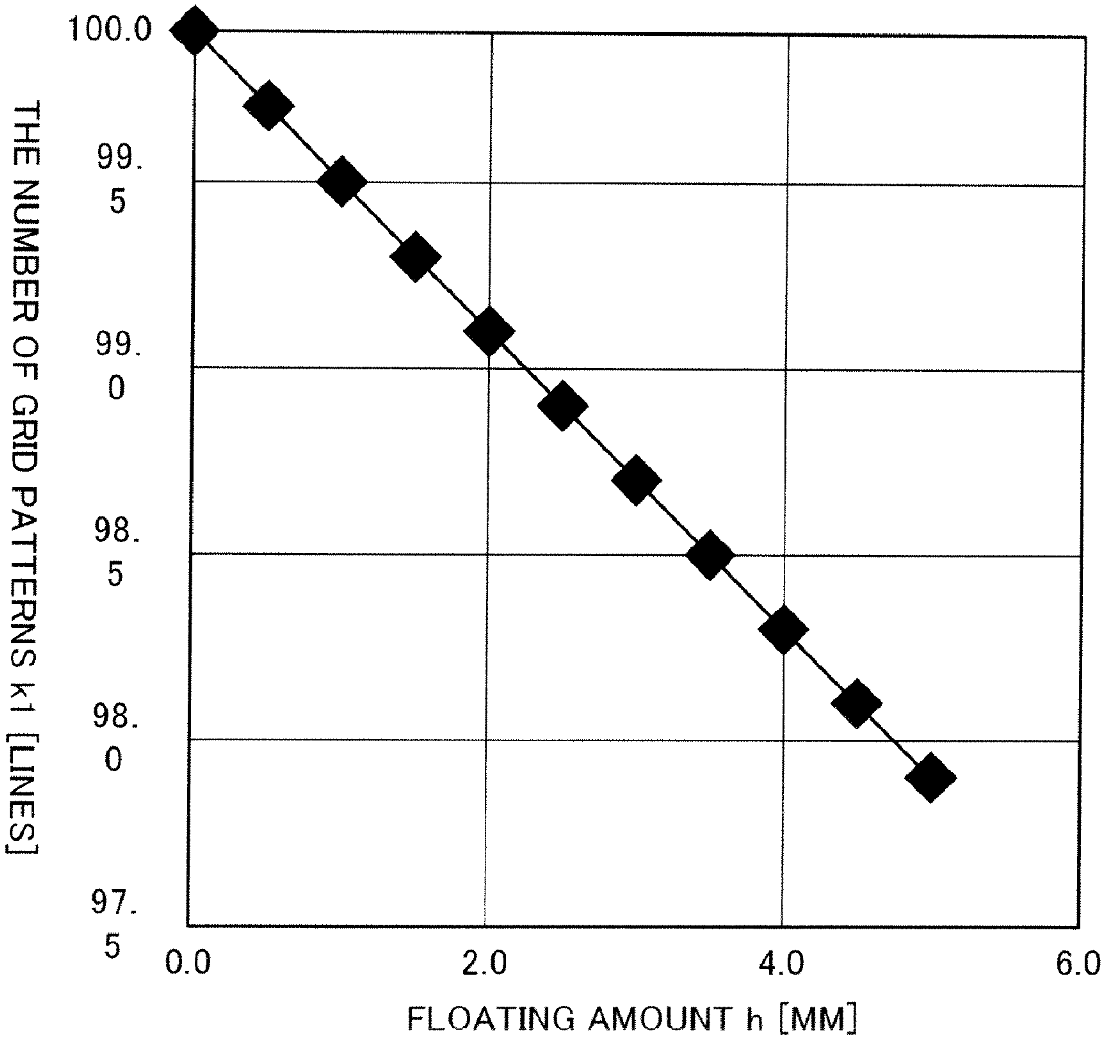
FIG. 18 is a graph showing a relationship between the floating amount of the paper sheet and the number of the captured grid patterns between the central pixel corresponding to the light axis center of the CCD image sensor and a predetermined pixel on the end portion side in the fast scan direction.

If k0=100, α=45 degrees, β=70 degrees, and W=100 mm, the relationship between the floating amount h of the paper sheet P and the number of the captured grid patterns between the central pixel corresponding to the light axis center C of the CCD image sensor 67 and a predetermined pixel on the end portion side in the fast scan direction k1 is shown in FIG. 18.

That is, as the floating amount h is increased, the number of the captured grid patterns k1 is linearly decreased. Accordingly, if the number of the grid patterns k1 within a predetermined area is calculated from the image capturing data (the grid pattern data), the floating amount h of the entire paper sheet P may be recognized. Additionally, if the number of the grid patterns k1 for each of the plural sections is calculated, the floating amount for each section of the paper sheet P may be recognized.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A reading apparatus comprising:

an optical image forming unit that forms an optical image on a recording medium by irradiating, with light, the recording medium on which an image is formed and which is transported in a slow scan direction;

a reading unit that reads a position in a fast scan direction of the image formed on the recording medium transported in the slow scan direction and a position in the fast scan direction of the optical image, by using a minification optical system; and a correction unit that corrects a magnification variation in the fast scan direction of the image read by the reading unit, by using the position in the fast scan direction of the optical image read by the reading unit, wherein the correction unit further corrects the magnification variation in the fast scan direction of the image read by the reading unit by using an end position of the recording medium read by the reading unit, and wherein the magnification variation in the fast scan direction of the captured image is due to the floating of the paper sheet.

2. The reading apparatus according to claim 1, wherein the optical image forming unit irradiates the recording medium with light at a projection angle different from an angle of view of the reading unit through the minification optical system.

3. The reading apparatus according to claim 1, wherein the optical image forming unit forms a plurality of optical images in the fast scan direction of the recording medium.

4. An image forming method comprising:

forming an image on a recording medium which is transported in a slow scan direction;

forming an optical image on the recording medium by irradiating, with light, the recording medium on which the image is formed and which is transported in the slow scan direction;

reading a position in a fast scan direction of the image formed on the recording medium transported in the slow scan direction and a position in the fast scan direction of the optical image, by using a minification optical system;

correcting a magnification variation in the fast scan direction of the read image by using the position in the fast scan direction of the read optical image;

further correcting the magnification variation in the fast scan direction of the image read by using an end position of the recording medium;

setting a transportation condition of a recording medium by using a corrected magnification in the fast scan direction of the image, and wherein the magnification variation in the fast scan direction of the captured image is due to the floating of the paper sheet.

5. A reading apparatus comprising:

a first irradiating unit that irradiates, with light, a recording medium on which an image is formed and which is transported in a slow scan direction, uniformly in a fast scan direction;

a second irradiating unit that irradiates, with light, the recording medium transported in the slow scan direction, selectively in the fast scan direction;

a light receiving unit that receives reflected lights in the fast scan direction, which are emitted from the first irradiating unit and the second irradiating unit, respectively, and are reflected by the recording medium, through a minification optical system; and a magnification correction unit that corrects magnification in the fast scan direction of a light receiving result of a reflected light derived from the first irradiating unit, by using a light receiving result of a reflected light derived from the second irradiating unit, which is received by the light receiving unit;

wherein the magnification correction unit further corrects magnification in the fast scan direction of a light receiving result of a reflected light derived from the first irradiating unit, by using the end position of the recording medium obtained from the light receiving result of the reflected light derived from the first irradiating unit, which is received by the light receiving unit, and wherein the magnification in the fast scan direction of the captured image is due to the floating of the paper sheet.

6. The reading apparatus according to claim 5, wherein the second irradiating unit irradiates the recording medium with light at an irradiating angle different from an angle of view of the light receiving unit through the minification optical system.

7. The reading apparatus according to claim 5, wherein the second irradiating unit irradiates the recording medium with higher intensity light than the first irradiating unit.

8. An image forming apparatus comprising:

a transporting unit that transports a recording medium in a slow scan direction;

an image forming unit that forms an image on the recording medium which is transported in the slow scan direction by the transporting unit;

an optical image forming unit that forms an optical image on the recording medium by irradiating, with light, the recording medium on which the image is formed by the image forming unit and which is transported in the slow scan direction by the transporting unit;

a reading unit that reads a position in a fast scan direction of the image formed on the recording medium transported in the slow scan direction and a position in the fast scan direction of the optical image, by using a minification optical system;

a correction unit that corrects a magnification variation in the fast scan direction of the image read by the reading unit by using the position in the fast scan direction of the optical image read by the reading unit; and a setting unit that sets a transportation condition of a recording medium transported by the transporting unit, by using a corrected magnification in the fast scan direction of the image, which is corrected by the correction unit, wherein the correction unit further corrects the magnification variation in the fast scan direction of the image read by the reading unit by using an end position of the recording medium read by the reading unit, and wherein the magnification variation in the fast scan direction of the captured image is due to the floating of the paper sheet.

9. The image forming apparatus according to claim 8, wherein the optical image forming unit irradiates the recording medium with light at a projection angle different from an angle of view of the reading unit through the minification optical system.

* * * * *